(12) United States Patent
Kajiyama

(10) Patent No.: US 6,172,898 B1
(45) Date of Patent: Jan. 9, 2001

(54) SEMICONDUCTOR MEMORY DEVICE

(75) Inventor: Takeshi Kajiyama, Yokohama (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/516,358

(22) Filed: Mar. 1, 2000

(30) Foreign Application Priority Data

Mar. 3, 1999 (JP) .................................. 11-056287

(51) Int. Cl.[7] .................................................. G11C 11/24
(52) U.S. Cl. .......................... 365/149; 365/63; 257/301
(58) Field of Search ........................... 365/149, 63, 51; 257/301, 300

(56) References Cited

U.S. PATENT DOCUMENTS

| | | | | |
|---|---|---|---|---|
| 4,792,834 | * | 12/1988 | Uchida ................... | 365/149 |
| 4,797,719 | * | 1/1989 | Ueda ...................... | 365/149 |
| 4,860,071 | * | 8/1989 | Sunami et al. .......... | 365/149 |
| 5,410,503 | * | 4/1995 | Anzai ..................... | 365/149 |
| 5,442,584 | * | 8/1995 | Jeong et al. ............ | 365/149 |
| 5,461,248 | * | 10/1995 | Jun ........................ | 257/301 |
| 5,895,946 | * | 4/1999 | Hamamoto et al. .... | 257/301 |

FOREIGN PATENT DOCUMENTS

| | | |
|---|---|---|
| 0 464 686 A1 | 1/1992 | (EP) . |
| 4-065872 | 3/1992 | (JP) . |
| 8-293587 | 11/1996 | (JP) . |

\* cited by examiner

*Primary Examiner*—Tan T. Nguyen
(74) *Attorney, Agent, or Firm*—Oblon, Spivak, McClelland, Maier & Neustadt, P.C.

(57) ABSTRACT

Trench capacitors are arranged in the form of a matrix at a constant pitch in row directions while being sequentially shifted between adjacent rows by a predetermined pitch. An element isolating insulator film is formed so as to surround active regions, each of which is adjacent to adjacent two capacitors in row directions, together with a partial region of the two capacitors. Transistors, which have gate electrodes continuously formed as word lines, are formed so as to be adjacent to the respective capacitors. One of the source and drain diffusion layers is connected to the capacitor node layer of a corresponding one of the capacitors via a connecting conductor. The other of the source and drain diffusion layers serves as a bit line contact layer shared by adjacent two transistors in the row directions, so that bit lines connected to the respective bit line contact layers in the row directions are formed. Three word lines are provided between adjacent bit line contact layers. By providing such a layout of a DRAM cell array, it is possible to decrease the area occupied by a unit memory cell while ensuring the capacity of a trench capacitor.

28 Claims, 38 Drawing Sheets

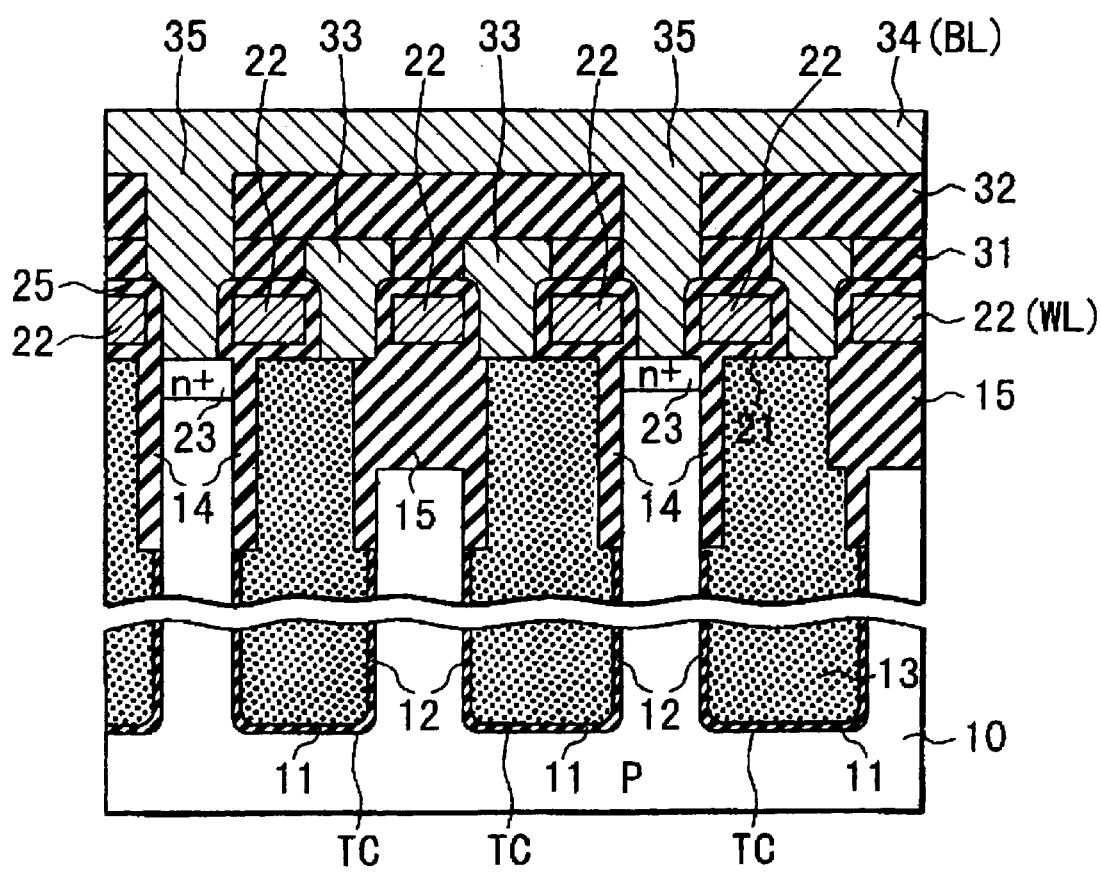
F I G. 2A

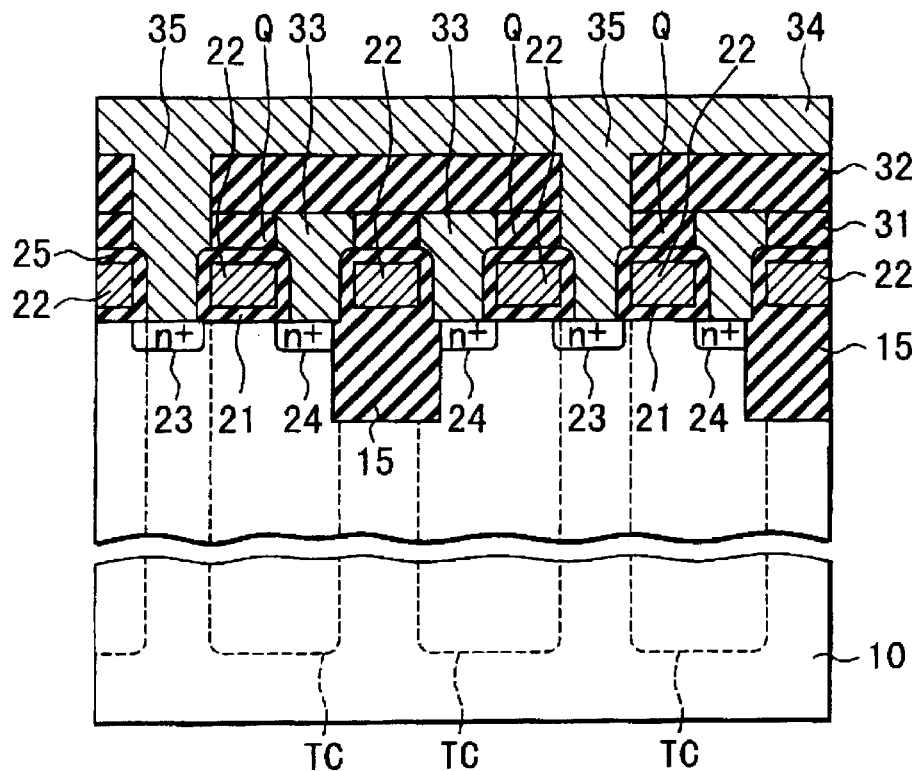
F I G. 2 B
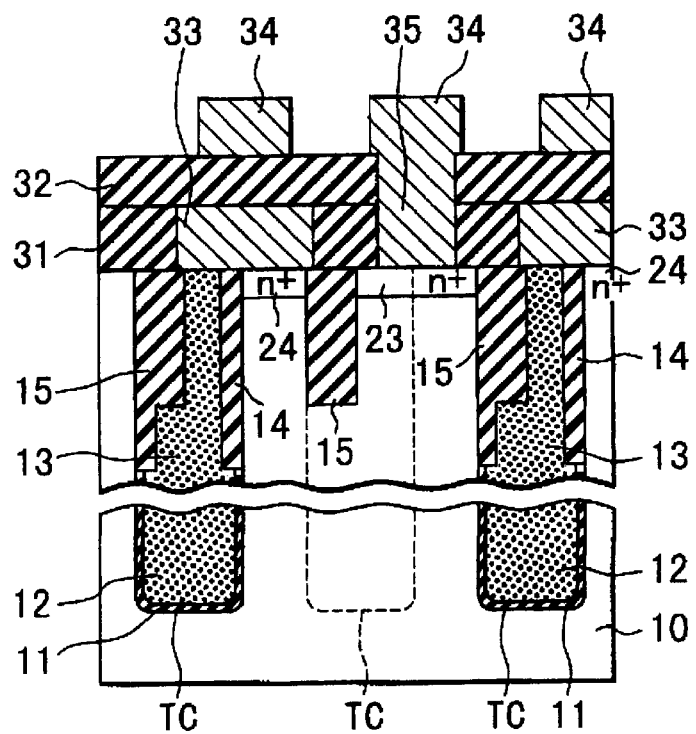
F I G. 2 C

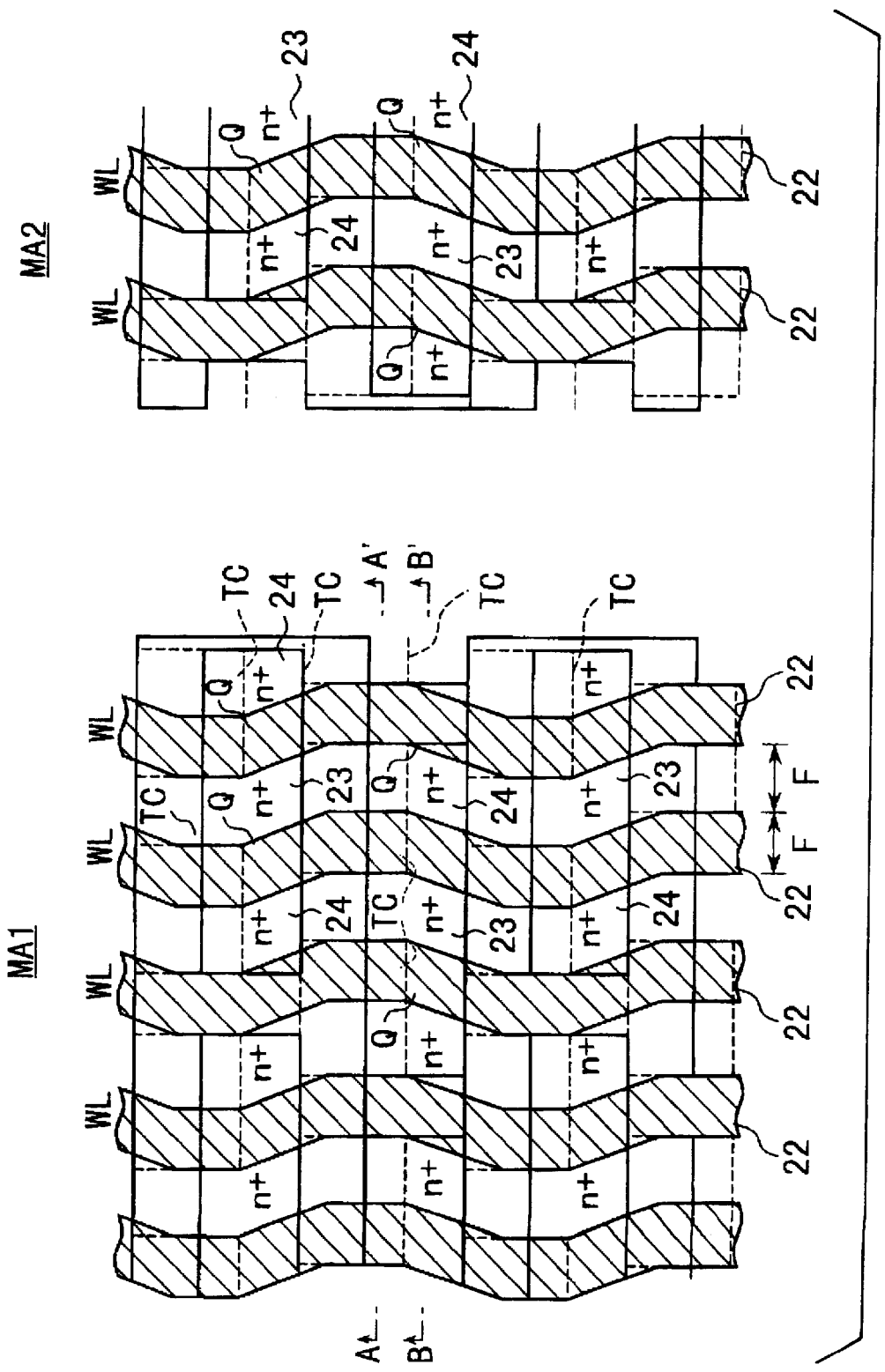
F I G. 7

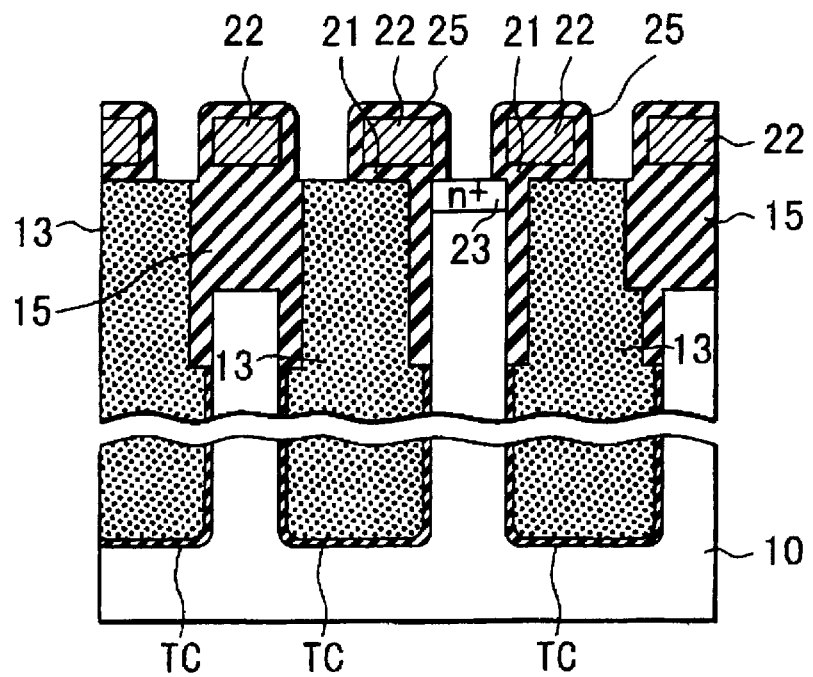
F I G. 8A
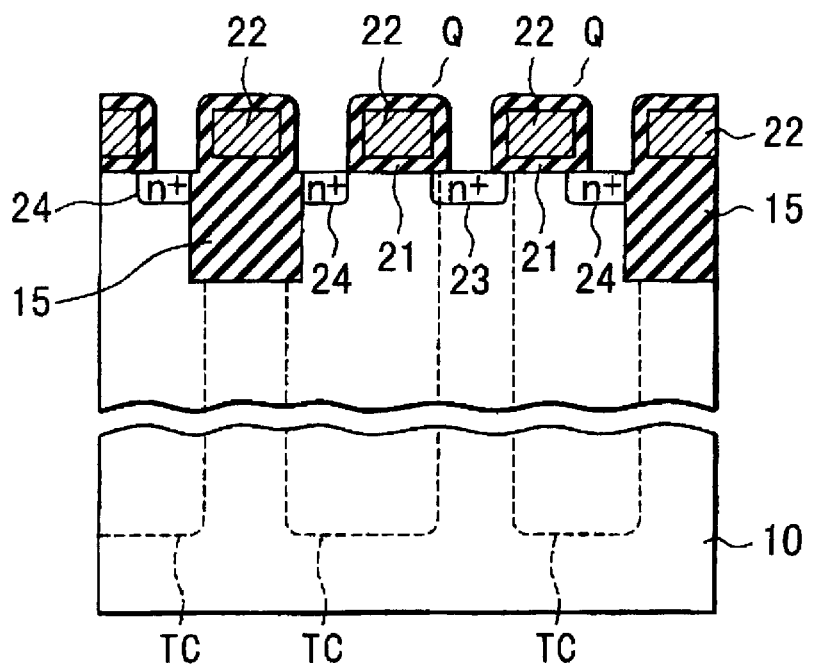
F I G. 8B

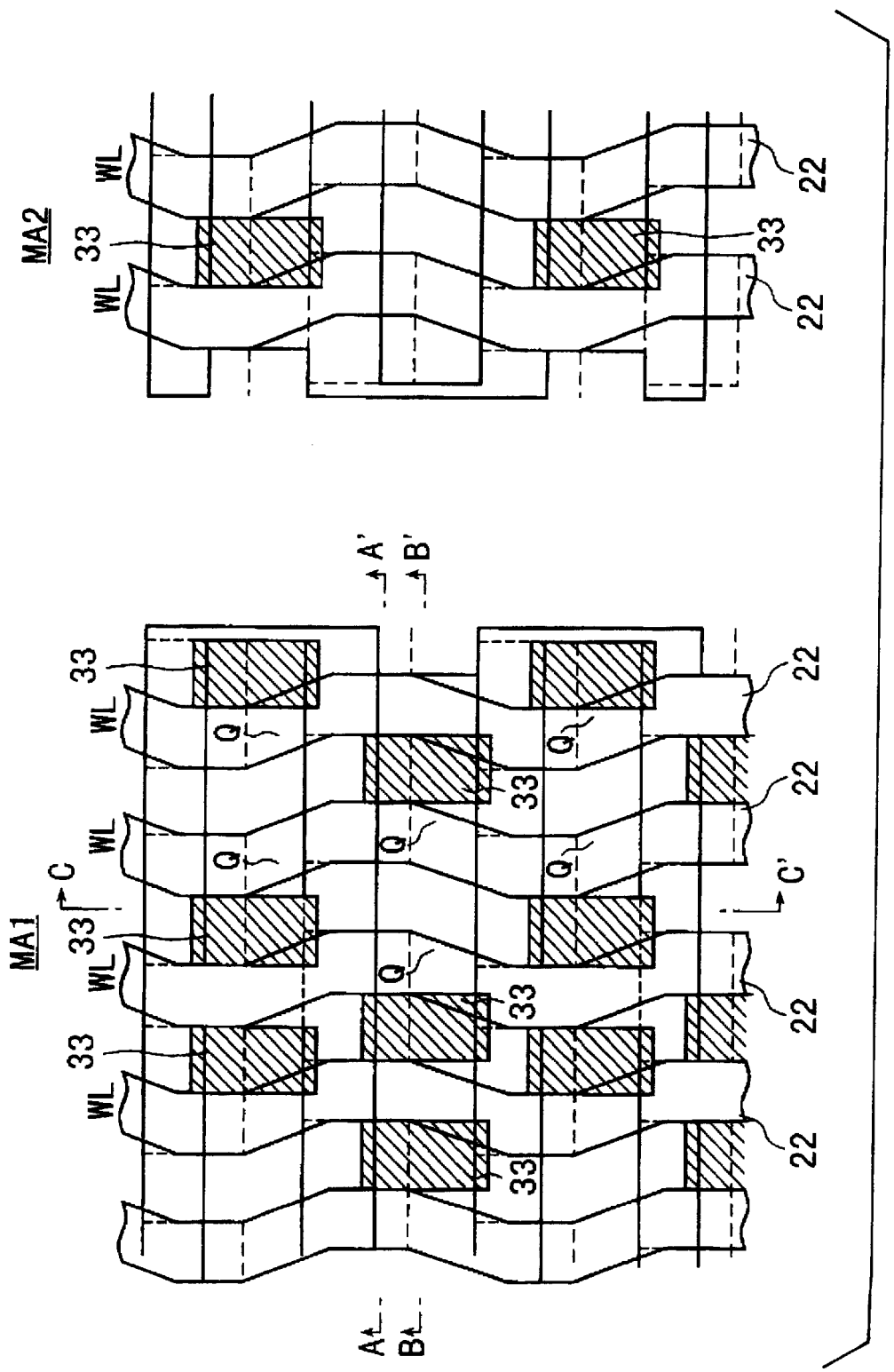
F I G. 9

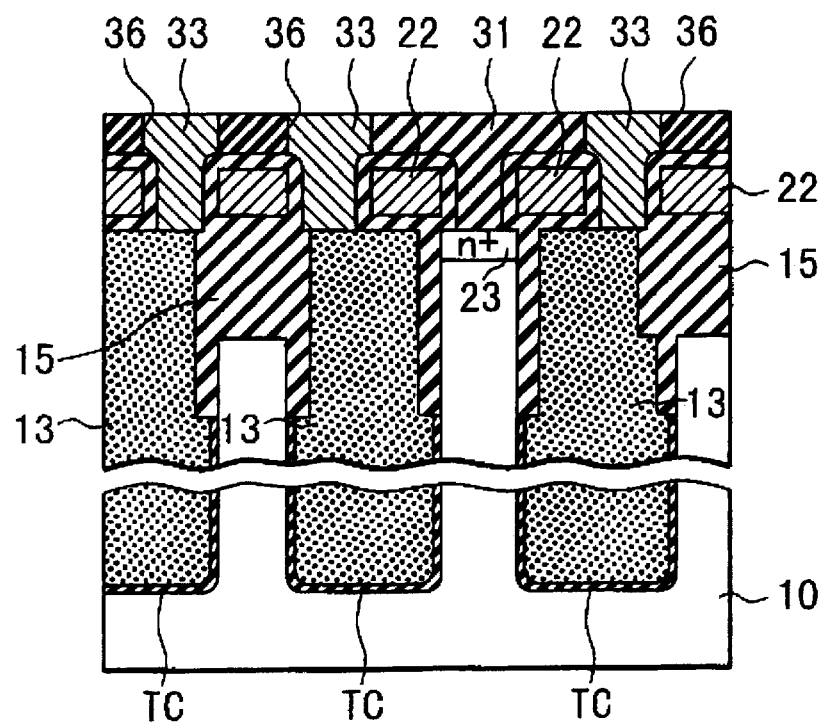
F I G. 10A
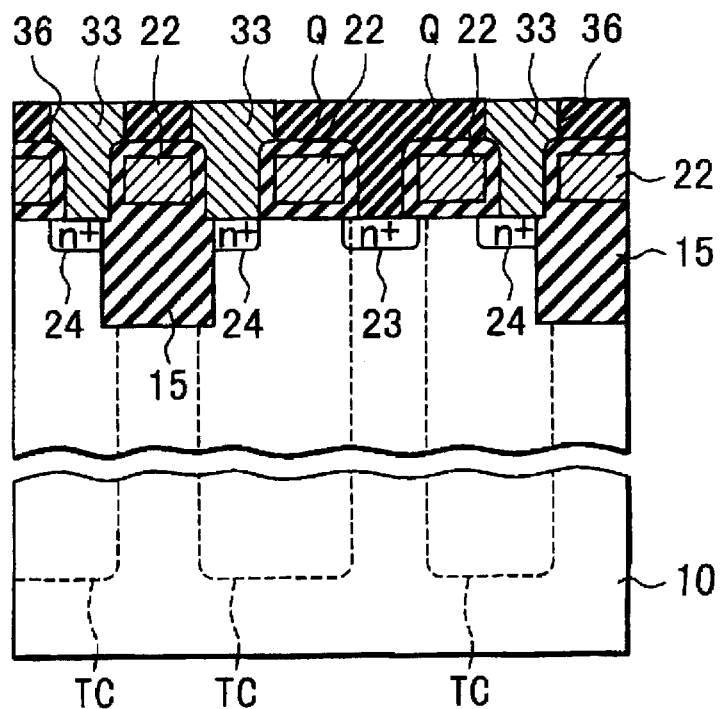
F I G. 10B

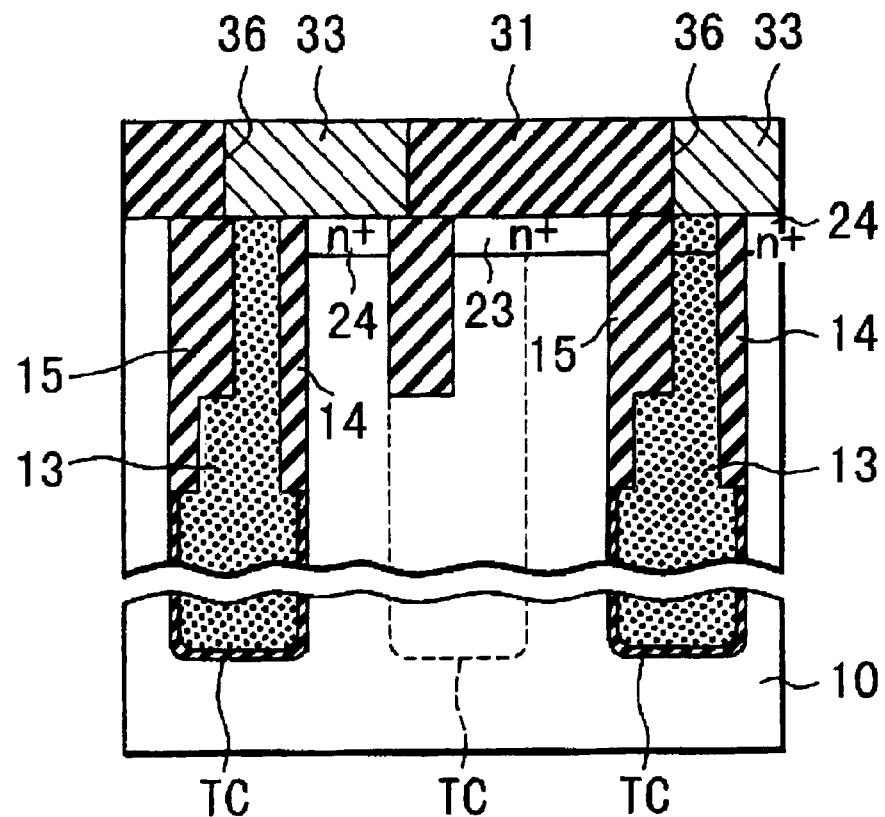
F I G. 10 C

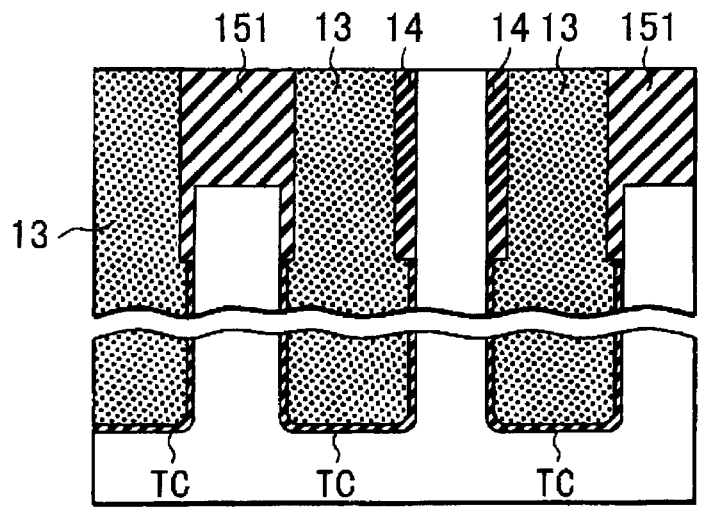
F I G. 12 A
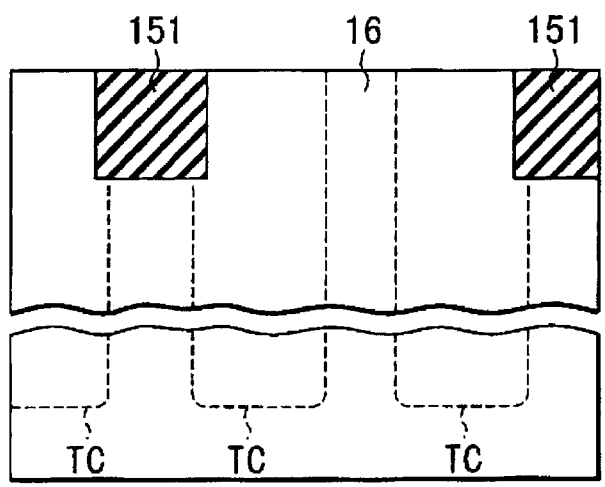
F I G. 12 B
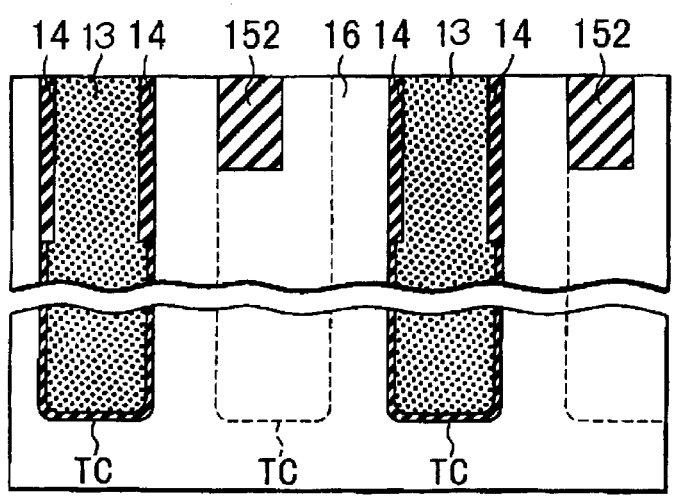
F I G. 12 C

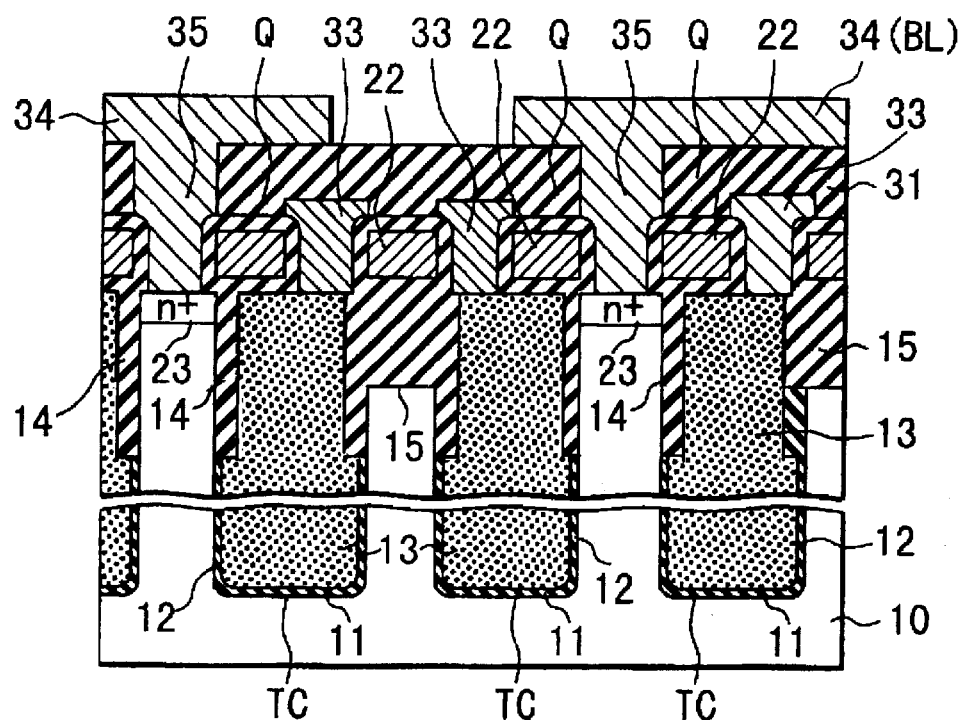
F I G. 14A
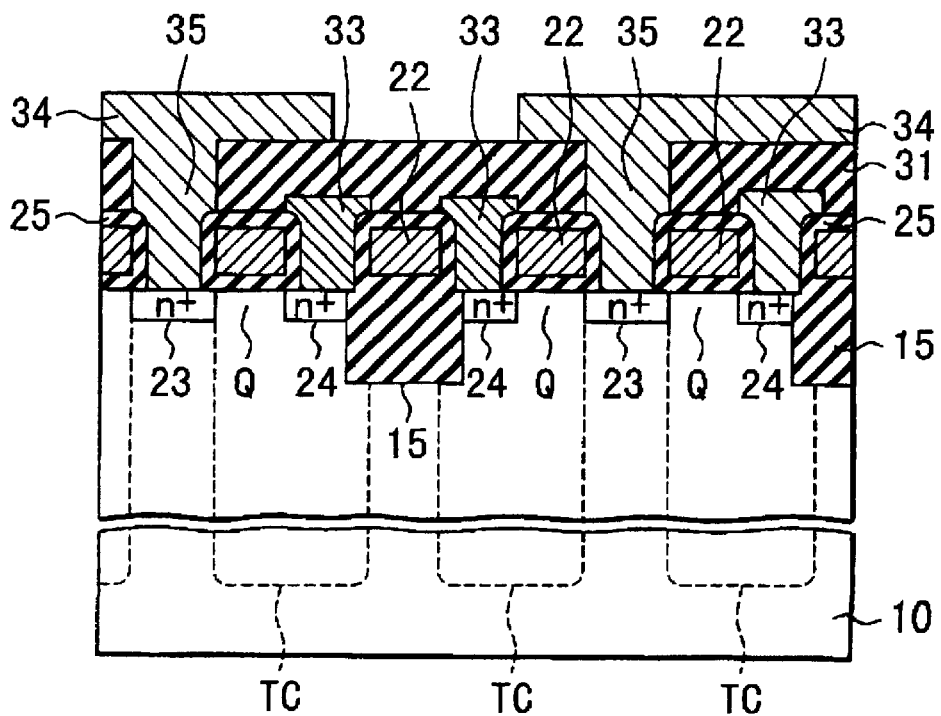
F I G. 14B

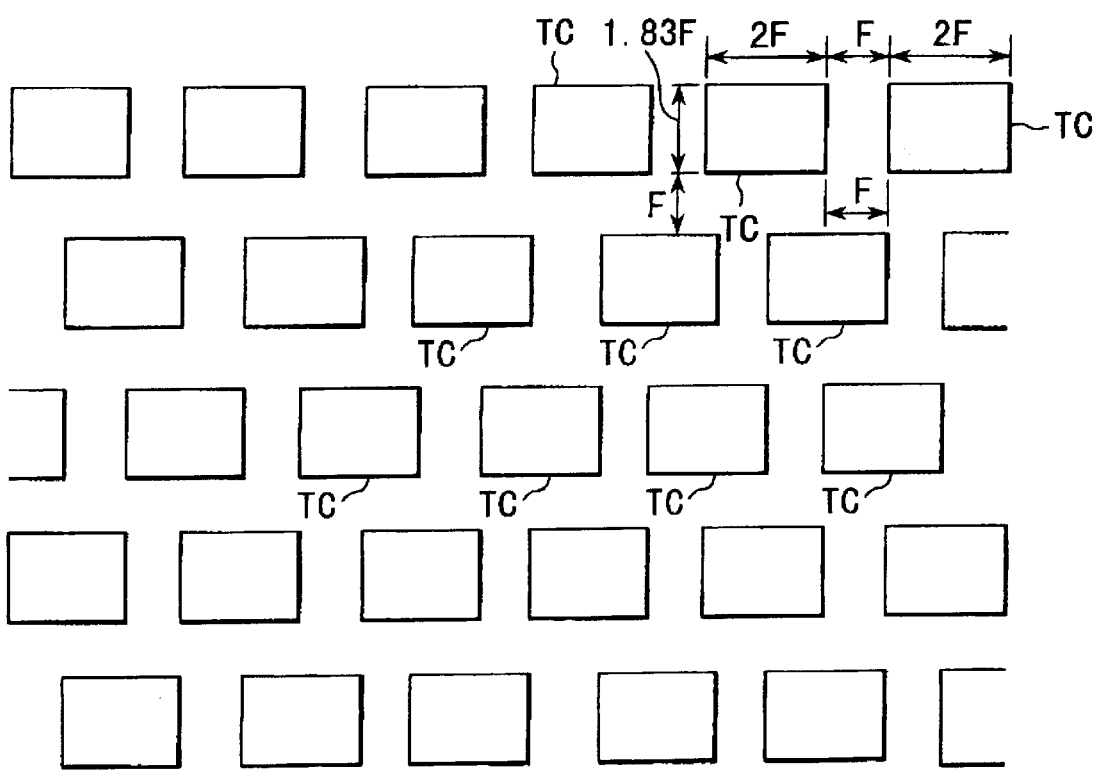
F I G. 15

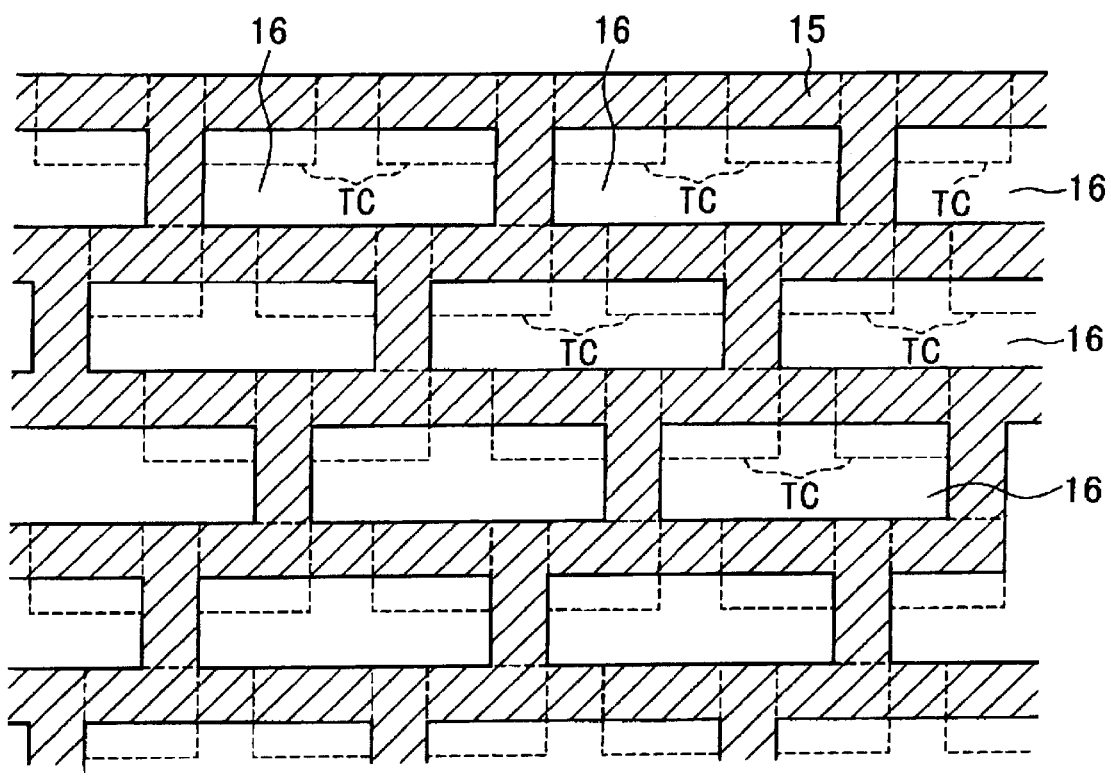
F I G. 16

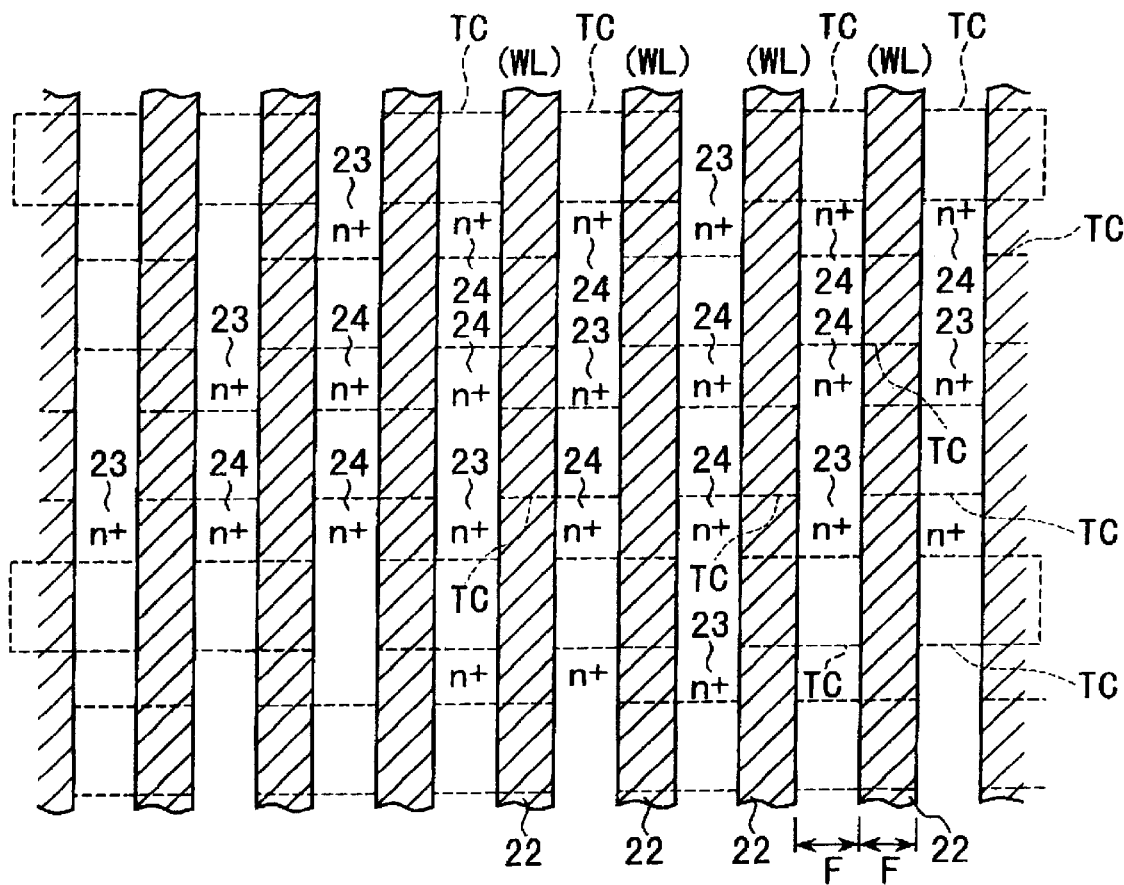
F I G. 17

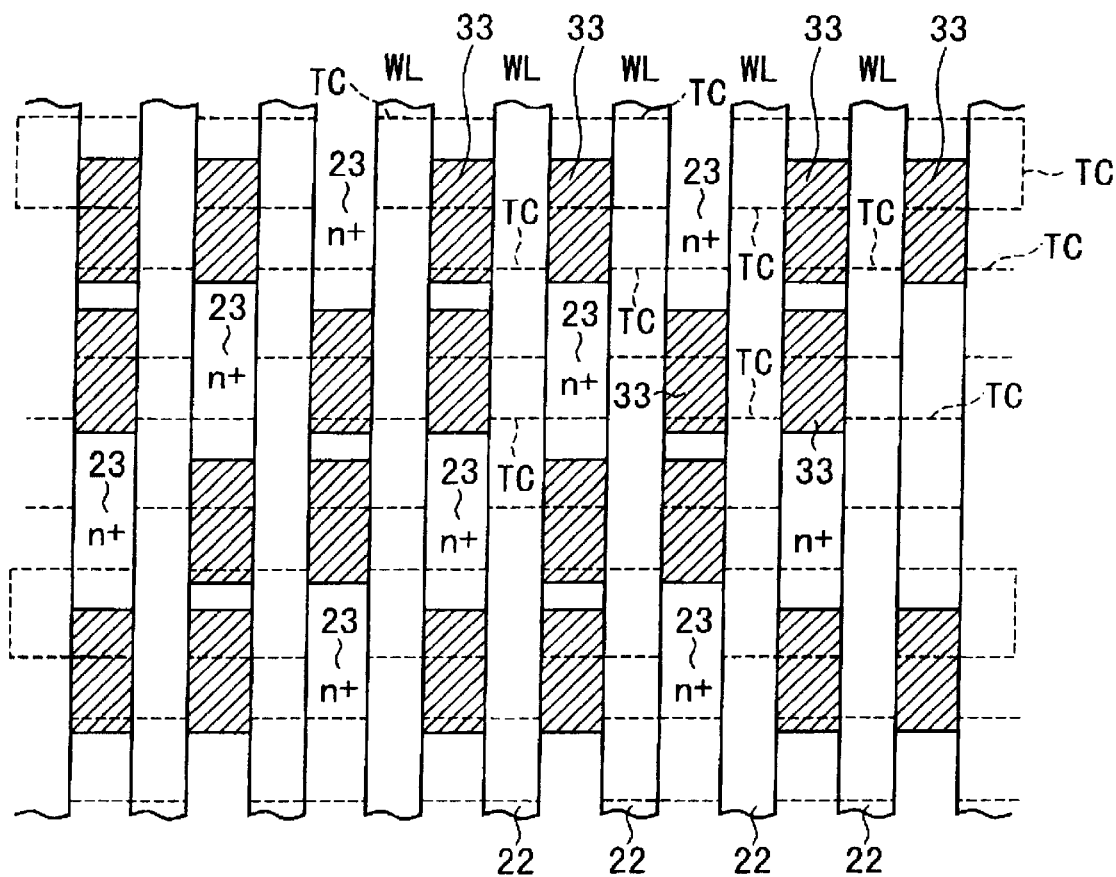
F I G. 18

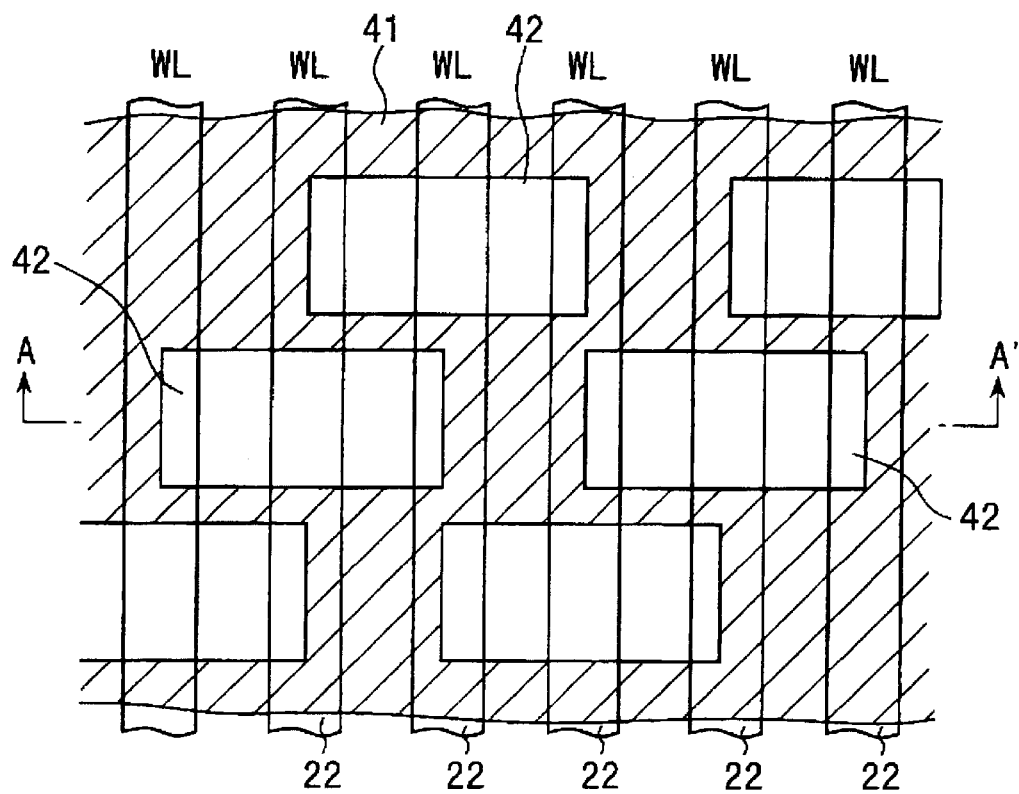
F I G. 20A
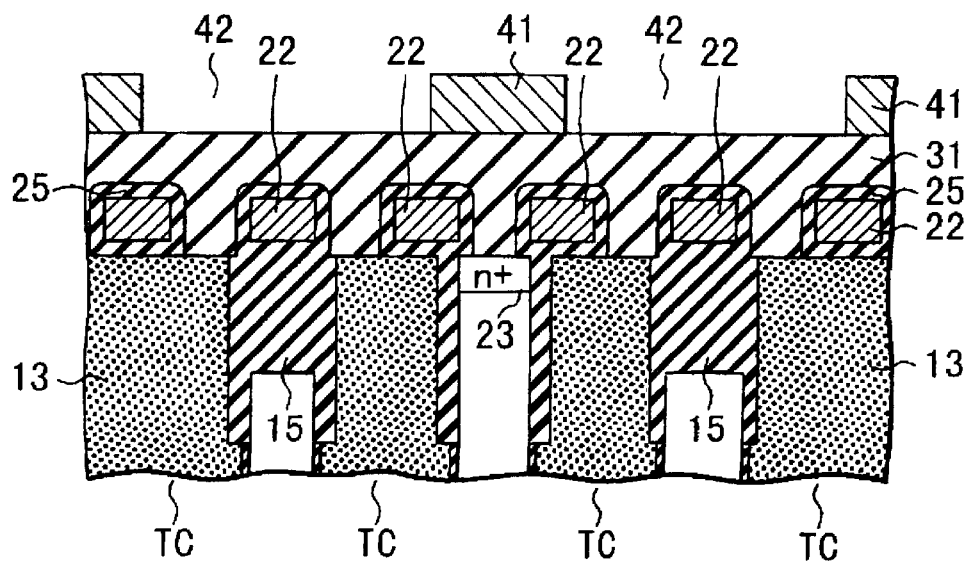
F I G. 20B

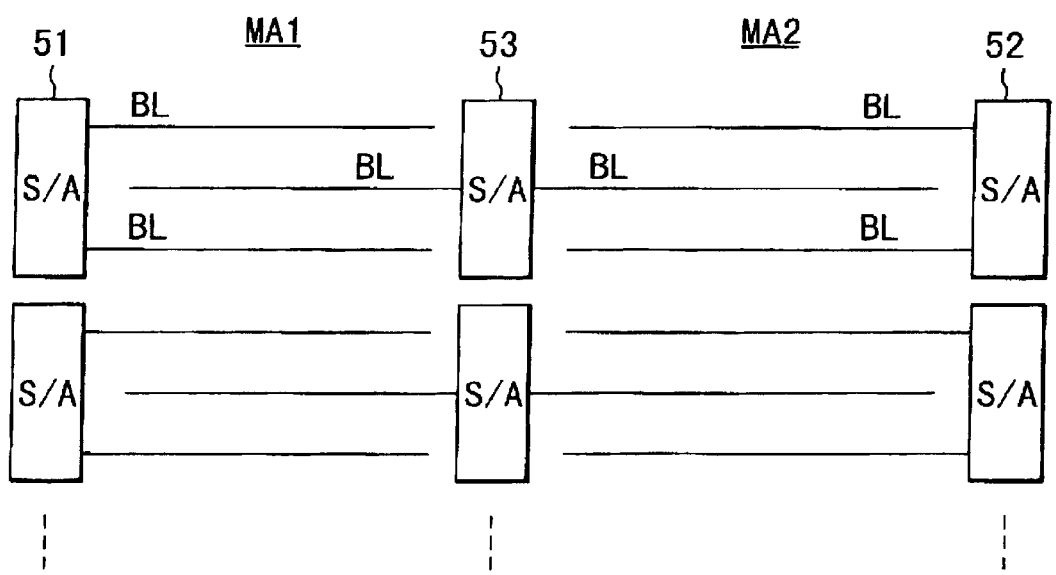
F I G. 22

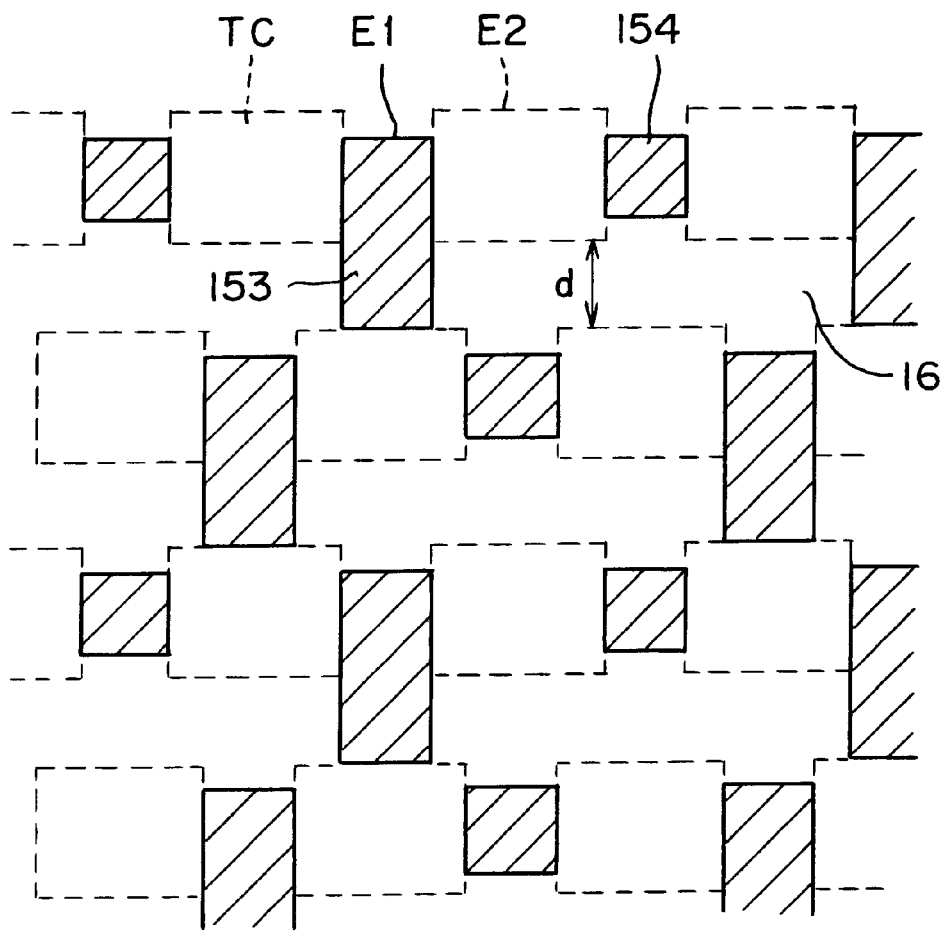
F I G. 27B

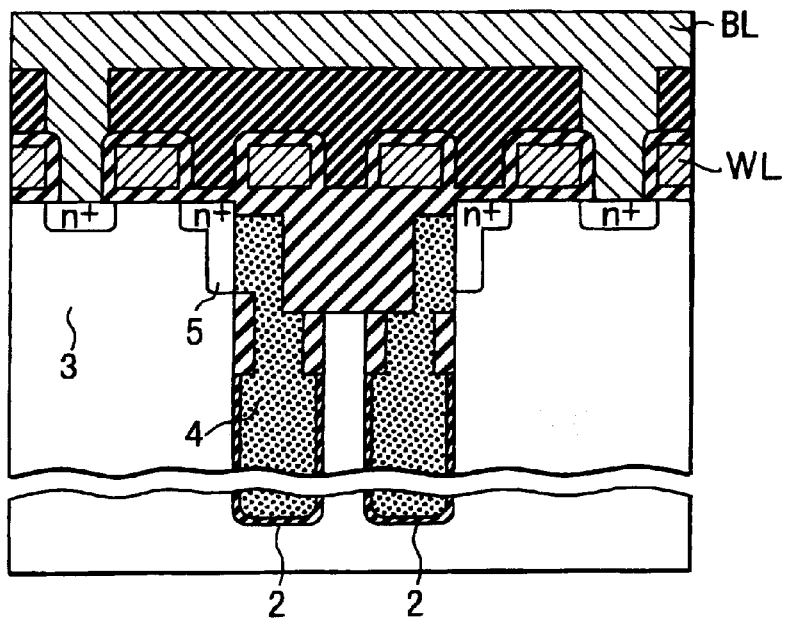
F I G. 29
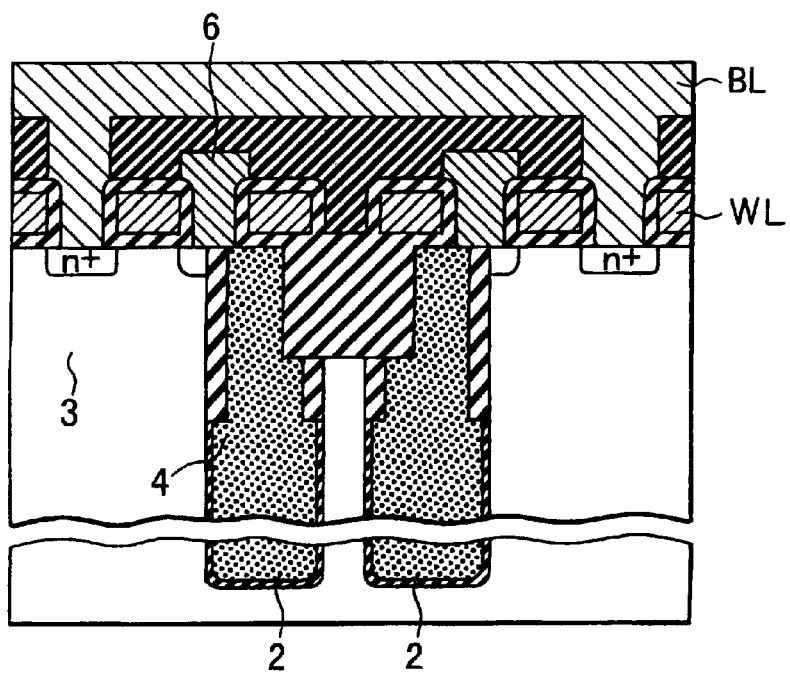
F I G. 30

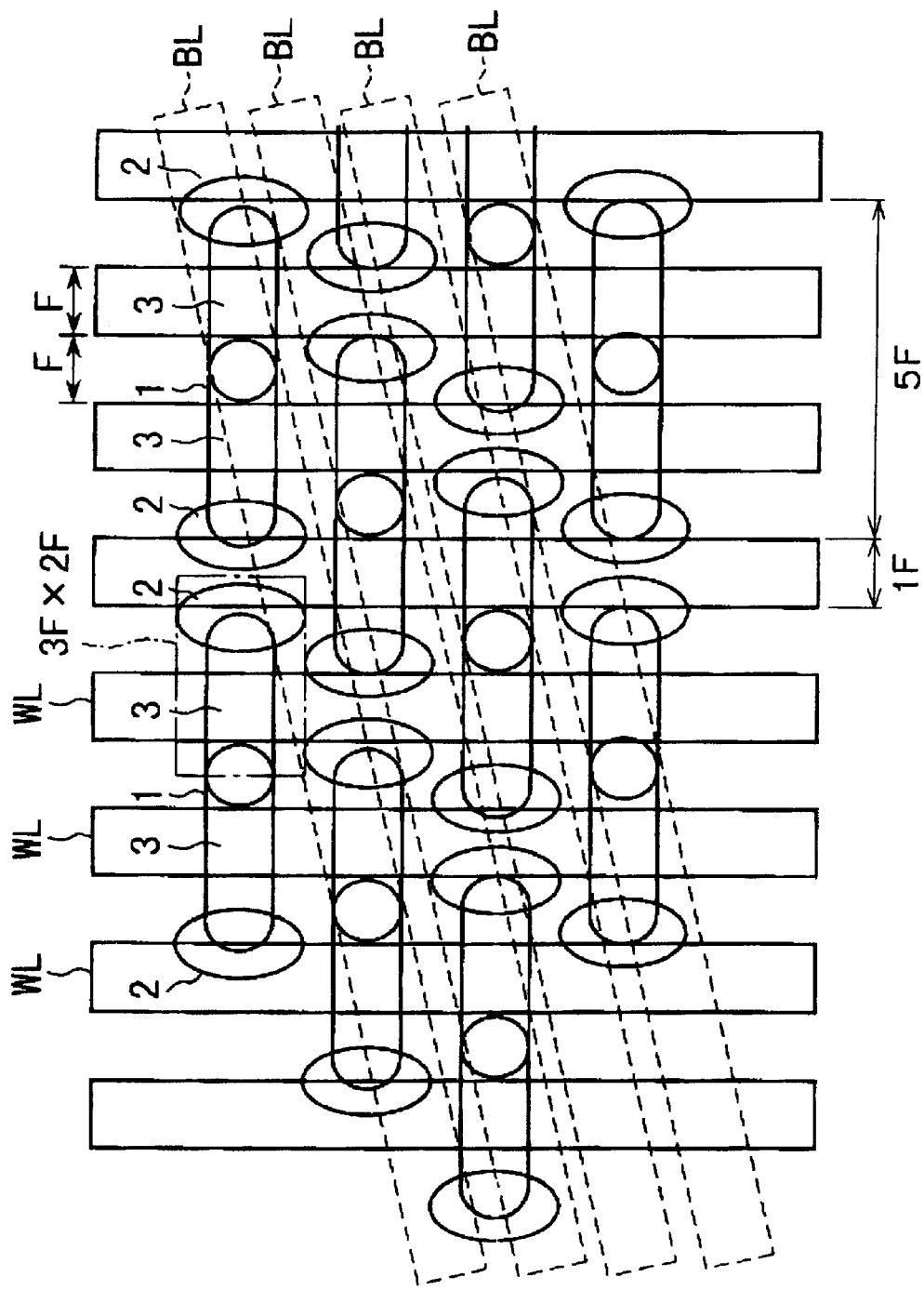
F I G. 31

SEMICONDUCTOR MEMORY DEVICE

RELATED APPLICATION

This application claims benefit of priority under 35 U.S.C. § 119 to Japanese Patent Application No. H11-56287, filed on Mar. 3, 1999, the entire contents of which are incorporated by reference herein.

BACKGROUND OF THE INVENTION

1. Field of the Invention

The present invention relates generally to a semiconductor memory device. More specifically, the invention relates to a layout structure of a DARM cell array using a trench capacitor.

2. Description of the Related Background Art

FIG. 28 shows an example of a conventional layout of a DRAM cell array using trench capacitors. On a semiconductor substrate, elongated island active regions 1 are arranged and formed, and trench capacitors 2 are formed on both ends of each of the active regions 1. In each of the active regions 1, there are formed transistors 3, each of which is associated with a corresponding one of the trench capacitors 2 on both sides to constitute a memory cell. The gate electrodes of the transistors 3 are continuously arranged in column directions as word lines WL. The source or drain diffusion layers of the transistors 3 arranged in row directions are connected to bit lines BL, and the drain or source diffusion layers of the transistors 3 are connected to corresponding trench capacitors 2.

The example of FIG. 28 is arranged and formed so that the active regions 1 have a width of 6F and a space of 2F between adjacent two thereof in the row directions and have a width of 1F and a space of 1F between adjacent two thereof in the column directions, assuming that the minimum working dimension is F. Both of the word lines WL and bit lines BL are formed so that line/space=1F/1F. Therefore, the area occupied by a unit memory cell shown by a chain line in the figure is $4F \times 2F = 8F^2$. The memory cell having this layout will be hereinafter referred to as a "$8F^2$ cell".

In DRAM cell arrays of this type, there are two systems for connecting the diffusion layers of the transistors 3 to the trench capacitors 2. As shown in FIG. 29, one of the systems utilizes a lateral diffusion layer 5 of the impurity of a capacitor node layer 4 of the trench capacitor 2 toward the active region 1. By the lateral diffusion layer 5, the diffusion layer of the transistor 3 is connected to the capacitor node layer 4 in the substrate. This system will be hereinafter referred to as a "buried strap system" As shown in FIG. 30, the other system is a system for connecting the capacitor node layer 4 of the trench capacitor 2 to the diffusion layer of the transistor 3 by means of a connecting conductor 6 formed on the substrate. This system will be hereinafter referred to as a "surface strap system".

FIG. 31 shows a layout of a DRAM cell array scaled down as compared with the $8F^2$ cell of FIG. 28. In this layout, the elongated island active regions 1 are formed so as to have a width of 4F and a space of 1F between adjacent two thereof in the row directions to be divided into smaller regions than those of FIG. 28. The size of a unit memory cell is $3F \times 2F = 6$ as shown by a dashed line in the figure. Therefore, the memory cell having this layout will be hereinafter referred to as a "$6F^2$ cell". In this layout of the $6F^2$ cell, the bit lines BL are provided so as to be inclined with respect to row directions so that the sense amplifier system is a folded bit line system. If the bit lines are provided so as to extend in directions perpendicular to the word lines WL similar to FIG. 28, two memory cells driven by one word line are connected to adjacent bit lines, so that it is not usually possible to adopt the folded bit line structure.

Although the $6F^2$ cell shown in FIG. 31 is scaled down as compared with the $8F^2$ cell shown in FIG. 28, there are the following disadvantages by the scale down.

(1) The area occupied by the trench capacitor 2 is about $1.5F \times 1F$ which is smaller than that of the $8F^2$ cell. It is not possible to ensure a smaller capacitor area than this since insulation failure occurs between adjacent active regions and/or since it is difficult to connect the capacitor to the transistor. Therefore, it is difficult to ensure a sufficient capacity of a capacitor.

(2) The distance between the trench capacitor 2 and the transistor 3 is small. Therefore, if either of the buried strap system or the surface strap system is used, it is difficult to surely connect the trench capacitor 2 to the diffusion layer of the transistor 3. For example, if the buried strap system is used, there is a disadvantage in that the lateral diffusion layer 5 of the impurity from the capacitor node layer 4 extends to the channel region of the transistor. This damages the normal operation of the transistor. In addition, if the surface strap system is used, it is not possible to sufficiently ensure the contact area of the connecting conductor 6 for connecting the capacitor 2 to the transistor 3. Moreover, if the surface strap system is used, generally, when the connecting conductor 6 is patterned, it is required to perform precise alignment between the word lines WL and the trench capacitors 2 in a lithography process. If the alignment is offset, it is not possible to surely connect the trench capacitor 2 to the diffusion layer of the transistor.

(3) In order to adopt the folded bit line system, it is required to cause the bit lines BL to incline as shown in FIG. 31. In this case, as can be clearly seen from the figure, the space between adjacent bit lines BL is less than 1F. Therefore, the bit lines BL must be formed in two layers.

SUMMARY OF THE INVENTION

It is therefore an object of the present invention to eliminate the aforementioned problems and to provide a semiconductor memory device having a layout of a DRAM cell array wherein the area occupied by a unit memory cell is the same as or less than a conventional area while ensuring the capacity of a trench capacitor and wherein the trench capacitor can be surely connected to a transistor.

In order to accomplish the aforementioned and other objects, according to one aspect of the present invention, a semiconductor memory device comprising:

a semiconductor substrate;

a plurality of trench capacitors arranged on the semiconductor substrate in the form of a matrix at a substantially constant pitch in row directions and the trench capacitors being sequentially shifted between adjacent rows by a predetermined pitch;

an element isolating insulator film formed so as to surround active regions, each of which is adjacent to two trench capacitors of the trench capacitors adjacent to each other in the row directions, the element isolating insulator film including a partial region of the two trench capacitors;

a plurality of transistors, each of which is formed in each of the active regions and each of which has source diffusion layer and drain diffusion layer, one of the source diffusion layer and drain diffusion layer being connected to a capacitor node layer of a corresponding one of the trench capacitors via a connecting conductor formed on the semiconductor substrate, and the other of the source diffusion layer and drain diffusion layer serving as one of bit line contact layers, which is shared by two transistors of the transistors adjacent to each other in the row directions;

a plurality of word lines, every three of which are arranged between adjacent two of the bit line contact layers arranged in the row directions so as to commonly connect gate electrodes of the transistors arranged in directions intersecting the row directions to each other; and a plurality of bit lines for commonly connecting the bit line contact layers in directions intersecting the word lines.

According to another aspect of the present invention, a semiconductor memory device comprising:

a semiconductor substrate;

a plurality of trench capacitors arranged on the semiconductor substrate in the form of a matrix at a substantially constant pitch in row directions and the trench capacitors being sequentially shifted between adjacent rows by a predetermined pitch;

an element isolating insulator film which forms active regions, each of the active region being adjacent to a pair of the trench capacitors in the row directions every adjacent two of the trench capacitors, and which constitutes at least part of an adjacent isolating wall for electrically separating the active regions from each other, the active regions being formed so as to extend in the row directions and being adjacent to the pair of the trench capacitors in the row directions;

a plurality of pair transistors, each of which has one bit line contact layer and two capacitor contact layers, the bit line contact layer being formed between the pair of the trench capacitors so as to be adjacent to the pair of the trench capacitors, the two capacitor contact layers being formed on both sides of the one of the active regions, and channels being formed between the bit line contact layer and the capacitor contact layers;

a plurality of connecting conductors, each of which connects the capacitor contact layer to a corresponding one of the trench capacitors;

a plurality of word lines continuously formed so as to commonly connect above the channels in the pair transistor arranged in first directions intersecting the row directions, every three of the word lines being arranged between adjacent two of the bit line contact layers in the row directions; and a plurality of bit lines continuously formed so as to commonly connect the bit line contact layers arranged in second directions intersecting the word lines.

Specifically, according to the present invention, (a) the trench capacitors are arranged in the form of a matrix at a constant pitch (e.g., a constant width and a smaller space than the width) in the row directions while being sequentially shifted between adjacent rows by ½ pitches, or (b) the trench capacitors are arranged in the form of a matrix at a constant pitch (e.g., a constant width and a smaller space than the width) in the row directions while being sequentially shifted between adjacent rows by ⅓ pitches.

In either case (a) or (b), the bit lines can be formed by patterning one conductor layer by moderating the design requirements for the array of the trench capacitors in the column directions. In addition, the bit line contact layers on the same row are commonly connected to each other, so that the bit lines are connected to the sense amplifiers by the open bit line system.

In the case of (b), if the bit lines are inclined with respect to the row directions so as to commonly connect the bit line contact layers on different rows, the bit lines can be connected to the sense amplifiers by the folded bit line system.

Specifically, according to the present invention, assuming that the minimum working dimension is F, the width and space of the array of the trench capacitors in the row directions are set to be 2F and F, respectively, and the line/space of the word lines is set to be 1F/1F. In addition, the array pitch of the trench capacitors in the column directions is preferably set to be in the range of from 2.5F to 3F.

Therefore, if the layout of the present invention is adopted, the area occupied by a unit memory cell can be the same as or less than that of the $8F^2$ cell. In addition, the trench capacitors can be surely connected to the transistors by the surface strap system.

Furthermore, according to the present invention, it is not required that all of the spaces between adjacent trench capacitors in the row directions should be the same, and the spaces in portions adjacent to the bit line contacts are allowed to be slightly greater than other spaces for the margins of the bit line contacts. That is, according to the present invention, the array of the trench capacitors in the row directions may have pitches slightly offset from a completely constant pitch.

In addition, the present invention includes a case where the element isolating insulator film does not form a complete closed path and part of the side wall insulator films of the trench capacitors are used for isolating elements.

Moreover, according to the present invention, the connecting conductors for connecting the transistors to the capacitors may be self-aligned to the word lines to be buried between adjacent word lines.

In addition to the layouts of the above described (a) and (b), (c) the trench capacitors may be arranged in the form of a matrix at a constant pitch (e.g., a constant width and a smaller space than the width) in the row directions while being sequentially shifted between adjacent rows by ⅕ pitches. In this case, the bit lines may be inclined with respect to the row directions so as to commonly connect the bit line contact layers on different rows, and the word lines may also be inclined with respect to the trench capacitor array so as to be perpendicular to the bit lines. In addition, it is possible to obtain a great capacitor area by setting the line/space for the bit lines and the line/space for the word lines to be 1F/1F.

According to the present invention, a method for producing a semiconductor device comprising the steps of: forming trench capacitors on a semiconductor substrate so as to be arranged in the form of a matrix at a substantially constant pitch in row directions while being sequentially shifted between adjacent rows by a predetermined pitch; forming an element isolating insulator film so as to surround active regions adjacent to every two adjacent trench capacitors in the row directions, together with a partial region of the two trench capacitors; forming transistors so that one of the source and drain diffusion layers of each of the transistors is shared by the active region as a bit line contact layer and so that every three gate electrodes continuously arranged in column directions as a word line are provided between adjacent two bit line contact layers in the row directions; forming connecting conductors, each of which connects the other of the source and drain diffusion layers of each of the transistors to the capacitor node layer of a corresponding trench capacitor; and forming bit lines for commonly connecting the bit line contact layers of the transistors in directions intersecting the word lines.

BRIEF DESCRIPTION OF THE DRAWINGS

In the drawings:

FIG. 2A is a sectional view taken along line A–A' of FIG. 1;

FIG. 2B is a sectional view taken along line B–B' of FIG. 1;

FIG. 2C is a sectional view taken along line C–C' of FIG. 1;

FIG. 7 is a diagram showing a layout in a word line forming process in the first preferred embodiment;

FIG. 8A is a sectional view taken along line A–A' of FIG. 7;

FIG. 8B is a sectional view taken along line B–B' of FIG. 7;

FIG. 9 is a diagram showing a layout in a connecting conductor forming process in the first preferred embodiment;

FIG. 10A is a sectional view taken along line A–A' of FIG. 9;

FIG. 10B is a sectional view taken along line B–B' of FIG. 9;

FIG. 10C is a sectional view taken along line C–C' of FIG. 9;

FIG. 12 is a sectional view taken along line A–A' of FIG. 11;

FIG. 12B is a sectional view taken along line B–B' of FIG.

FIG. 12C is a sectional view taken along line C–C' of FIG.

FIG. 14A is a sectional view taken along line A–A' of FIG. 13;

FIG. 14B is a sectional view taken along line B–B' of FIG. 13;

FIG. 15 is a diagram showing a layout in a trench capacitor forming process in the third preferred embodiment;

FIG. 16 is a diagram showing a layout in an element isolating insulator film forming process in the third preferred embodiment;

FIG. 17 is a diagram showing a layout in a word line forming process in the third preferred embodiment;

FIG. 18 is a diagram showing a layout in a connecting conductor forming process in the third preferred embodiment;

FIG. 22 is an equivalent circuit diagram showing a sense amplifier system of a DRAM in the seventh preferred embodiment of the present invention;

FIG. 27B is a diagram showing a layout (½ pitch) after an element isolating insulator film is formed in the tenth preferred embodiment;

FIG. 29 is a sectional view showing a connection state between a transistor and a capacitor using a conventional buried strap system;

FIG. 30 is a sectional view showing a connection state between a transistor and a capacitor using a conventional surface strap system; and FIG. 31 is a diagram showing a layout of a conventional DRAM cell array.

DESCRIPTION OF THE PREFERRED EMBODIMENTS

Referring now to the accompanying drawings, the preferred embodiments of the present invention will be described below.

(First Preferred Embodiment)

Figure 1:
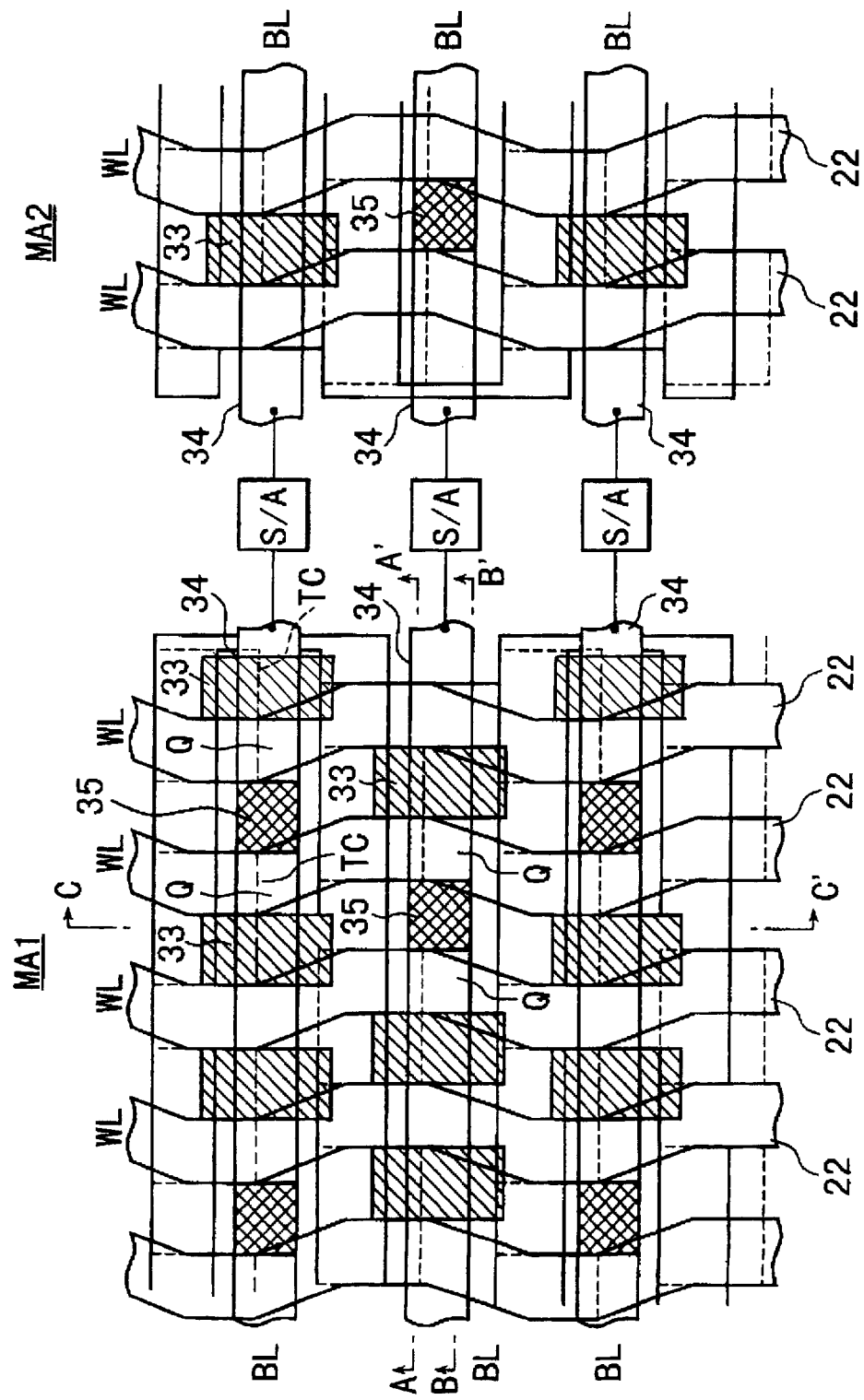
FIG. 1 is a diagram showing a layout of the first preferred embodiment of a DRAM cell array according to the present invention.

FIG. 1 shows a layout of the first preferred embodiment of a DRAM cell array according to the present invention. FIGS. 2A, 2B and 2C are sectional views taken along lines A–A', B–B' and C–C', respectively.

In accordance with the steps of producing the DRAM cell array, the construction of the DRAM cell array will be described below.

Figure 3:
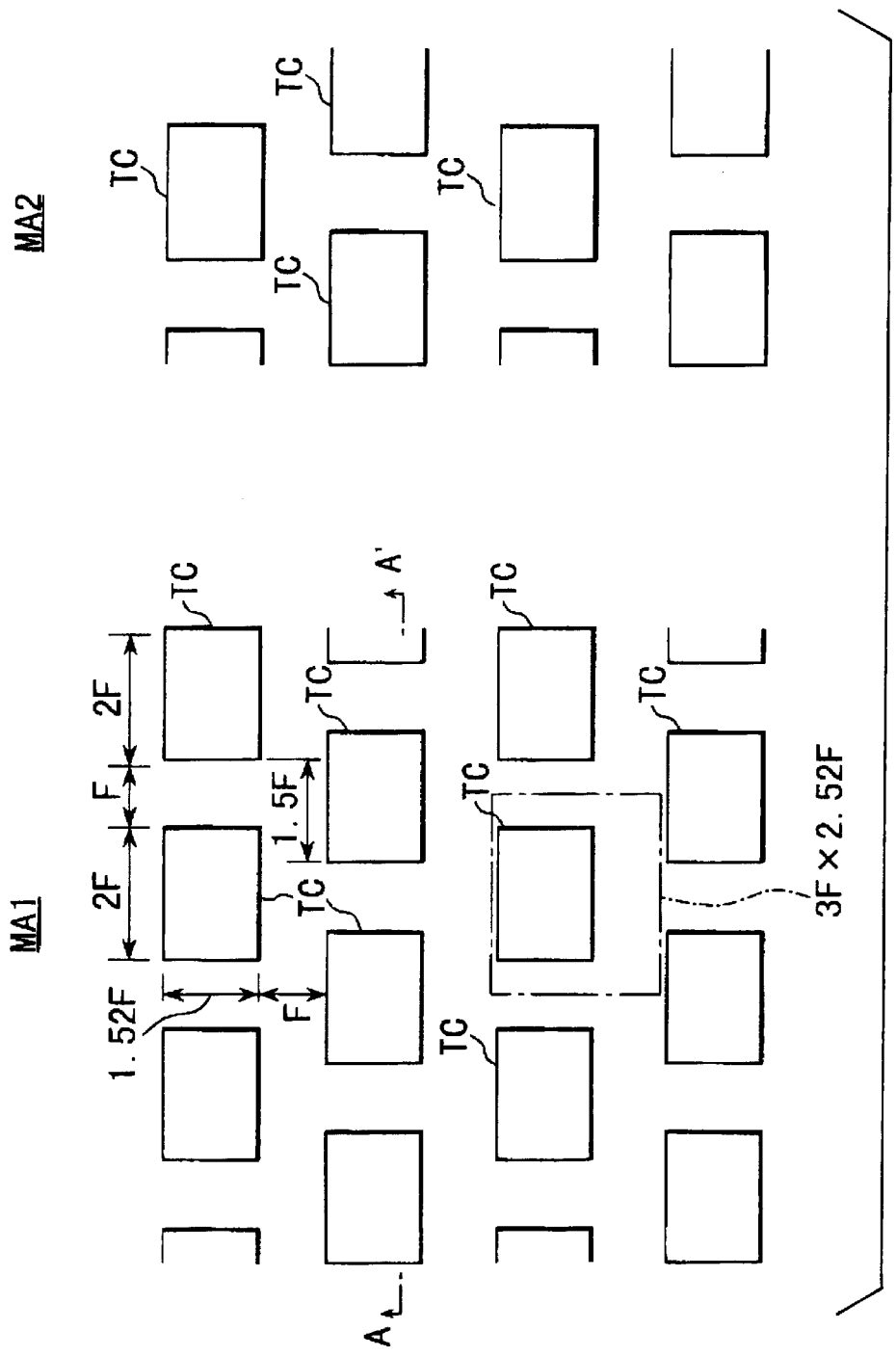
FIG. 3 is a diagram showing a layout in a trench capacitor forming process in the first preferred embodiment.
Figure 4:
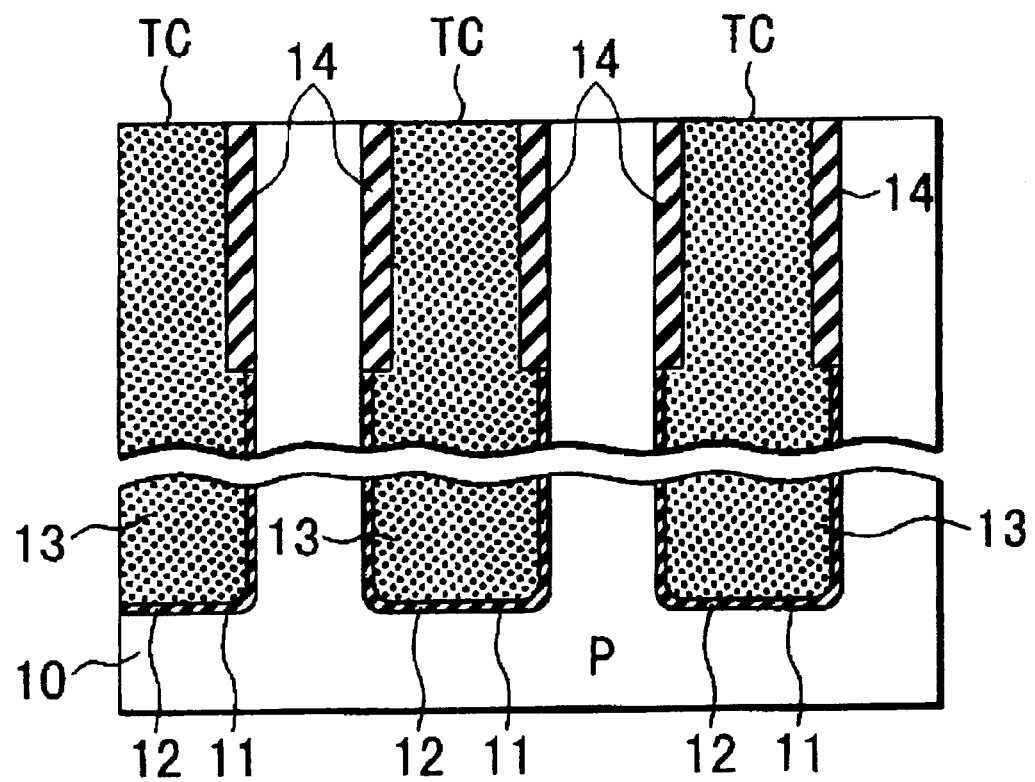
FIG. 4 is a sectional view taken along line A—A of FIG. 3.

FIG. 3 shows a layout of trench capacitors TC formed on a silicon substrate 10 so as to be arranged in the form of a matrix, and FIG. 4 shows a cross section taken along line A–A' thereof. Each of the trench capacitors TC is formed by forming a trench 11 in the substrate 10, forming a capacitor insulator film 12 on the side wall thereof, and burying a capacitor node layer 13 of an impurity doped polycrystalline silicon. In the upper portion of the trench 11, a side wall insulator film (color insulator film) 14 is formed.

In this preferred embodiment, as shown in FIG. 3, each of the trench capacitors TC has a width of 2F in row directions and a width of 1.5F in column directions. In addition, the space between adjacent trench capacitors TC is F in the row direction and F in the column directions. However, F is the minimum working dimension (design rule) which is the same in preferred embodiments which will be described later. The array pitch of the trench capacitors TC is 3F in the row directions, and the matrix is arranged so that the trench capacitors TC are sequentially shifted between adjacent rows by 1.5 F (i.e., ½ pitches).

In this case, the size of a unit memory cell is shown by a dashed line in FIG. 3, and the area occupied by the memory cell is $3F \times 2.52F = 7.56F^2$.

Figure 5:
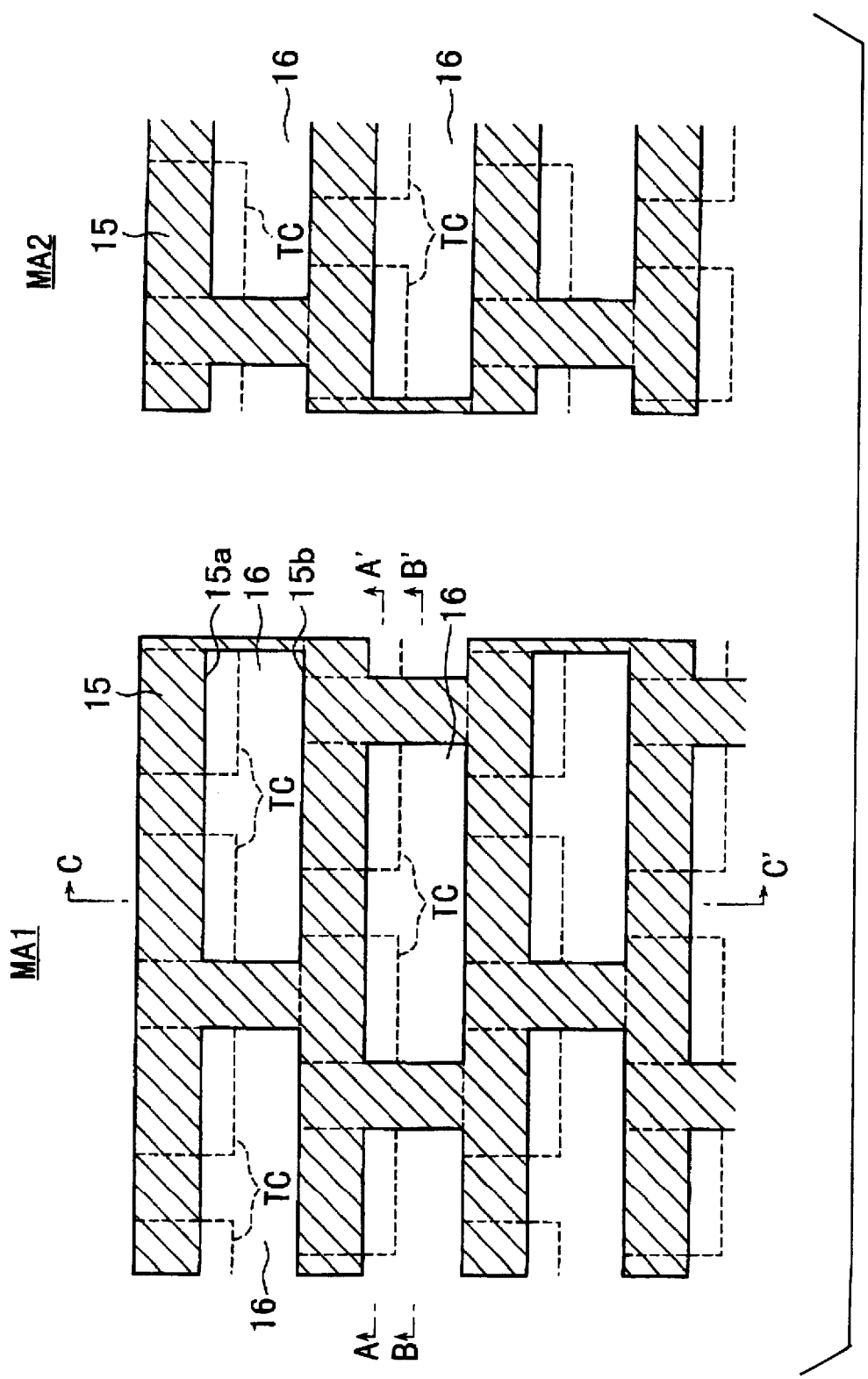
FIG. 5 is a diagram showing a layout in an element isolating insulator firm forming process in the first preferred embodiment.
Figure 6A:
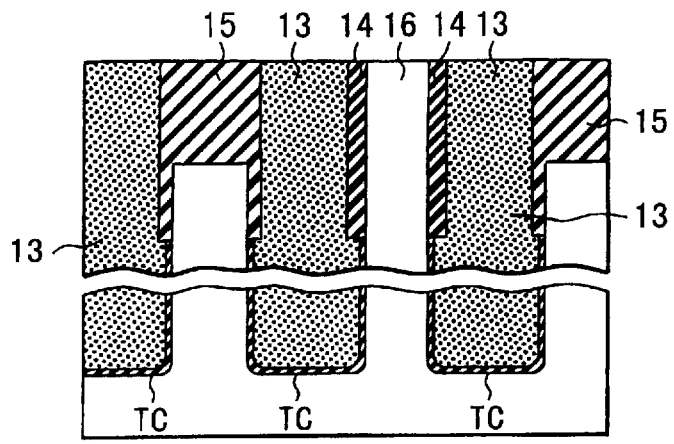
FIG. 6A is a sectional view taken along line A–A' of FIG. 5.
Figure 6B:
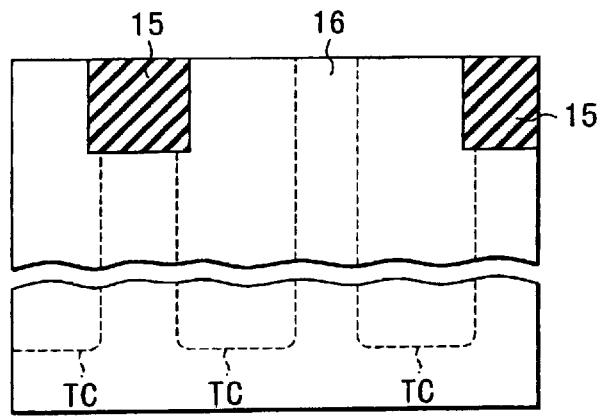
FIG. 6B is a sectional view taken along line B–B' of FIG. 5.
Figure 6C:
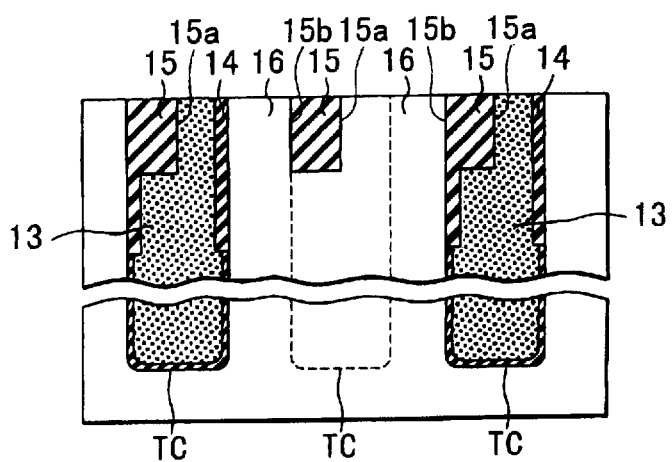
FIG. 6C is a sectional view taken along line C–C' of FIG. 5.

As shown in FIGS. 5 and 6A through 6C, an element isolating insulator film 15 is buried in the substrate 10, in which the trench capacitors TC have been arranged and formed, by the shallow trench isolation (STI) method. FIG. 5 shows a layout thereof, and FIGS. 6A through 6C are sectional views taken along lines A–A', B–B' and C–C' thereof, respectively. As shown in the figures, the element isolating insulator film 15 is formed so as to surround the active regions 16 adjacent to the trench capacitors TC every two trench capacitors TC adjacent to each other in the row directions.

Specifically, the region divided by the element isolating insulator film 15 is divided into the active region 16 and a region for the trench capacitor TC, and the active region 16 is separated as a region adjacent to two of the trench capacitors TC. In other word, the element isolating insulator film 15 surrounds the active region 16 and part of the trench capacitor TC adjacent to the active region 16. In other words, one edge 15a of edges 15a and 15b of the element isolating film 15 facing each other in the column directions crosses the vicinity of the center of the trench capacitor TC, and the other edge 15b overlaps with the edge of the trench capacitor TC adjacent thereto in the column directions. Thus, the active region 16 has a convex pattern. Such an element isolating structure is adopted to ensure a region for connecting a transistor, which will be formed later, to the trench capacitor TC and to ensure a bit line contact 35. The central portion of the active region 16, i.e., a portion adjacent to spaces for two trench capacitors TC, serves as the bit line contact.

Thereafter, as shown in FIGS. 7, 8A and 8B, two transistors Q, each of which is associated with a corresponding one of two trench capacitors TC to constitute a memory cell, are formed in each of the active regions 16. FIG. 7 shows a layout thereof, and FIGS. 8A and 8B are sectional views taken along lines A–A' and B–B' thereof, respectively. Each of the transistors Q has a gate insulator film 21, a gate electrode 22 patterned thereon, and source and drain diffusion layers 23, 24 self-aligned on the gate electrode 22. The gate electrodes 22 are sequentially patterned for the transistors Q, which are arranged in the column directions, to serve as a word line WL. Since the trench capacitors TC are arranged so as to be shifted by ½ pitches between adjacent rows, the gate electrodes 22, i.e., the word line WL, are formed so as to meander as shown in FIG. 7, and the line/space thereof is 1F/1F.

One diffusion layer 23 of the source and drain diffusion layers 23 and 24 of each of the transistors Q serves as a bit line contact layer shared by adjacent two memory cells, and the other diffusion layer 24 is connected to the capacitor node layer 13 of a corresponding one of the trench capacitors TC by means of a connecting conductor 33 which will be formed later.

The side walls and top of each of the gate electrodes 22 are covered with an insulator film 25.

FIG. 9 shows a layout of connecting conductors 33, each of which is formed for connecting the capacitor node (storage nodes) layer 13 to the diffusion layer 24 of the corresponding transistor Q on the surface of the substrate. FIGS. 10A, 10B and 10C are sectional views taken along lines A–A', B–B' and C–C' of FIG. 9, respectively. The surface of the substrate having formed with the transistors Q is covered with an interlayer insulator film 31. Then, contact holes 36 are formed in the interlayer insulator film 31, and connecting conductors 33 are buried therein. As shown in FIG. 10C, each of the connecting conductors 33 contacts the diffusion layer 24 while passing over the side wall insulator film 14 of the trench capacitor to contact the capacitor node layer 13.

Thereafter, as shown in FIGS. 1 and 2A through 2C, bit lines (BL) 34 are provided on interlayer insulator films 32. The bit lines 34 are formed by patterning one conductor layer, and continuously provided to cross over the word lines WL so as to commonly connect the diffusion layers 23 arranged in the row directions. The bit line contact 35 on the diffusion layers 23 is self-aligned so as to be formed between adjacent gate electrodes 22. As is well known, the self-aligned contact of the bit line BL is available by forming the interlayer insulator films 31 and 32 of silicon oxide films, forming the insulator film 25 of a silicon nitride film for covering the side walls and top of the gate electrode 22, and utilizing the etching selectivity thereof.

As described above, in the DRAM cell array according to the preferred embodiment, three gate electrodes 22 (i.e., word lines WL) are arranged between adjacent bit line contacts 35 in the row directions. This is the same as that of the 6F² cell shown in FIG. 31, and has a smaller pitch in the row directions than that of the 8F² cell shown in FIG. 18. The different point from the 6F² cell shown in FIG. 31 is that the memory cell region is enlarged in the column directions. As described above, although the array pitch of the trench capacitors TC in the column directions is 2.52F in the first preferred embodiment, this may be suitably set in the range of 2.5F through 3F (from 2.5F to 3F inclusive).

In the first preferred embodiment, the area occupied by the unit memory cell is 7.56F² which is smaller than that of the 8F² cell. In addition, the size of the trench capacitor TC is 2F×1.52F, which is the same as or greater than that of the 8F² cell. Therefore, it is possible to obtain a large capacity by a small cell area. Furthermore, when the sense amplifier S/A is connected by an open bit line system as this preferred embodiment, the size and array of the trench capacitors TC should not be limited to the above described values.

In this preferred embodiment, the design requirements in the column directions are moderated, and the region separated by the element isolating insulator film 15 is divided into the active region 16 and the capacitor region as described above. In addition, the connecting conductor 33 for connecting the diffusion layer 24 to the capacitor node layer 13 by the surface strap system can contact the diffusion layer 24 and the capacitor node layer 13 by areas of about 0.76F², respectively. Therefore, it is possible to surely connect the transistor Q to the trench capacitor TC with a low resistance.

Moreover, in the first preferred embodiment, the pitch of the line/space of the bit lines (BL) 34 is large, about 2.5F, by the moderation of the design requirements in the word line directions(column directions). That is, the pitch of the bit lines BL can be greater than that of the 6F² shown in FIG. 31, so that the bit lines can be formed by patterning one conductive wiring layer (however, the wiring layers does not include the contact buried layer).

Furthermore, in the first preferred embodiment, as shown in FIG. 1, there is adopted the open bit line system wherein the sense amplifiers S/A are arranged between adjacent memory cell arrays MA1 and MA2 and wherein each of the bit lines BL serving as a pair of memory cell arrays MA1 and MA2 is connected to a corresponding one of the sense amplifier S/A.

(Second Preferred Embodiment)

FIGS. 11 and 12A through 12C show the second preferred embodiment of an element isolating structure according to the present invention, which correspond to FIGS. 5 and 6A through 6C, respectively. Constructions other than the element isolating structure, i.e., the structure and layout of the trench capacitors TC, the layout of the word lines WL and bit lines BL corresponding thereto, the dimensions thereof, and the method for producing the same, are the same as those in the preceding first preferred embodiment.

In the preceding first preferred embodiment, the element isolating insulator film 15 forms a complete closed path to surround the active region 16 and the capacitor region adjacent thereto. On the other hand, in the second preferred embodiment, in order to surely connect the transistors Q to trench capacitors TC which are associated with the transistors Q to constitute memory cells, the element isolating insulator film 15 does not form a complete closed path, and is partially open. That is, the element isolating insulator film 15 comprises two kinds of patterns of a T-shaped pattern insulator film 151 and a rectangular pattern insulator film 152. The T-shaped pattern insulator film 151 is provided for surely isolating active regions 16 adjacent in the row and column directions from each other. The rectangular pattern insulator film 152 is provided for isolating the active regions 16 adjacent in the column directions from each other, and specifically, for isolating the diffusion layers (i.e., the bit line contact layers) of the central portions of the active regions 16 from the diffusion layers (i.e., the diffusion layers used for the connection with the trench capacitors TC) of the active regions 16 adjacent thereto in the column directions.

Figure 11:
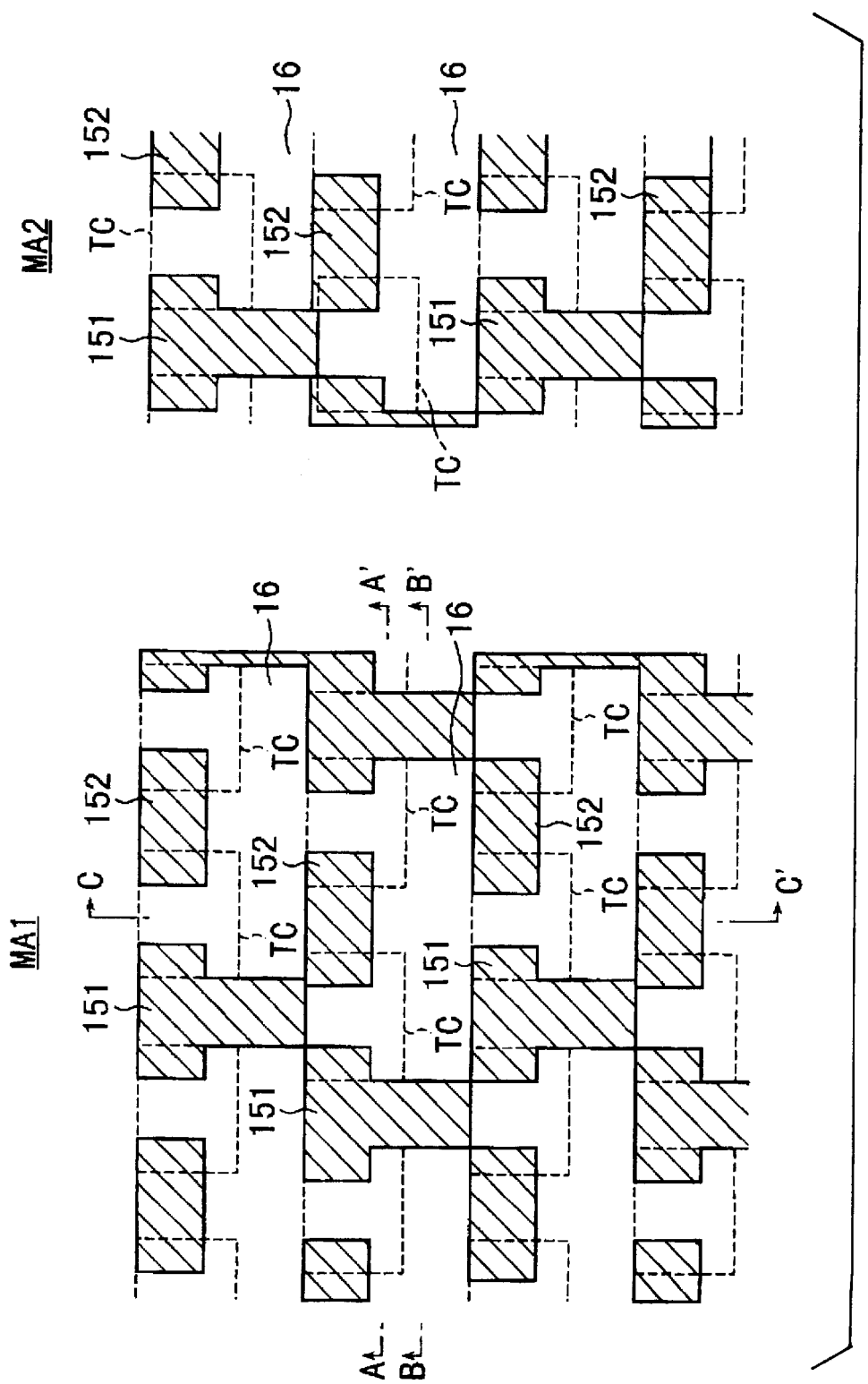
FIG. 11 is a diagram showing a layout in an element isolating insulator film forming process in the second preferred embodiment of a DARM cell array according to the present invention.

Therefore, in the second preferred embodiment, as can be clearly seen from the comparison of FIG. 12C showing a cross section taken along line C–C' of FIG. 11 with FIG. 6C showing a corresponding cross section in the first preferred embodiment, the side wall insulator film 14 of the trench capacitor TC is utilized directly as the element isolating insulator film, with respect to a portion adjacent to the bit line contact portion of the active region 16 adjacent in the column directions to one of two trench capacitors TC adjacent to one active region 16. In other words, the trench capacitor TC of one memory cell is isolated from the active region 16 of the memory cell adjacent to the trench capacitor TC in the column directions by a part of the side wall insulator film 14 of the trench capacitor TC. Thus, the side wall insulator film 14 of the trench capacitor TC is substituted for a part of the element isolating insulator film 15 crossing over the trench capacitor TC in the row directions, so that the contact area of the connecting conductor 33 to the capacitor node layer 13 can be greater than that in the first preferred embodiment. That is, it is possible to more surely connect the transistor Q to the capacitor TC by the surface strap system with a low resistance.

(Third Preferred Embodiment)

Figure 13:
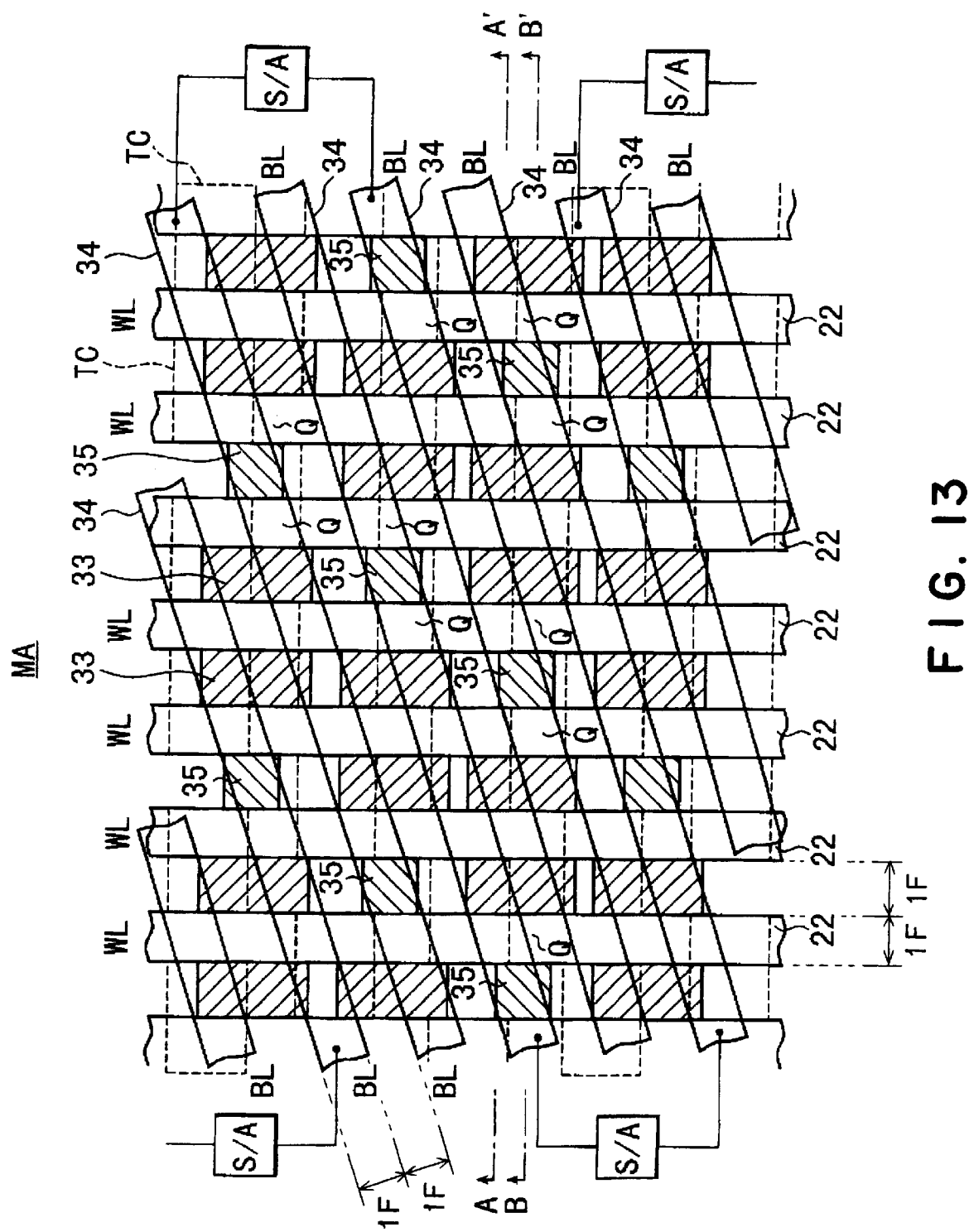
FIG. 13 is a diagram showing a layout of the third preferred embodiment of a DRAM array according to the present invention.

FIG. 13 shows a layout of the third preferred embodiment of a DRAM cell array MA according to the present invention, and FIGS. 14A and 14B are sectional views taken along lines A–A' and B–B' of FIG. 13, respectively. The basic construction and producing process in this preferred embodiment are the same as those in the first preferred embodiment. Therefore, the same reference numbers are used for portions corresponding to those in the first preferred embodiment, and the detailed descriptions thereof are omitted.

First, in the third preferred embodiment, the layout of the trench capacitors TC is different from that in the first preferred embodiment. FIG. 15 shows the layout of the trench capacitors TC so as to correspond to that in FIG. 3. Although the size of the trench capacitor TC and the array pitch and space thereof in the row directions are the same as those in the first preferred embodiment, the array pitch thereof in the column directions is 2.83F. However, this array pitch in the column directions may be suitably set in the range of 2.5F through 3F. In addition, the shift of the capacitor array between adjacent rows is 1F, i.e., ⅓ pitches. In this case, the area occupied by a unit memory cell is 2.83F×3F=8.49F²≈8.5F².

As shown in FIG. 16, the layout of the element isolating insulator film 15 is formed so as to surround the active region 16 contacting adjacent two trench capacitor TC. As can be clearly seen from the comparison with corresponding FIG. 5, it is the same as the first preferred embodiment that the space between the element isolating insulator films 15 is divided into two parts by the boundary of the trench capacitor TC contacting the active region 16, i.e., a part of the trench capacitor TC is not covered with the element isolating insulator film 15.

By adopting the above described capacitor layout, the gate electrodes 22 of MOS transistors Q, i.e., the word lines WL, are linearly arranged in the column directions as shown in FIG. 17. The line/space of the word lines WL is 1F/1F similar to the preceding preferred embodiments. The source and drain diffusion layers 23 and 24 of the transistors Q are self-aligned to the word lines WL to be formed.

Then, the interlayer insulator film 31 is formed, and contact holes are formed therein. Then, as shown in FIG. 18, the connecting conductors 33 for connecting the diffusion layers 24 of the MOS transistors Q to the capacitor node layers 13 of the trench capacitors TC are formed. Moreover, as shown in FIGS. 13, 14A and 14B, the bit lines (BL) 34 are provided by patterning one conductor film. In this preferred embodiment, the bit lines BL are inclined with respect to the row directions so that the diffusion layers 23, which are the bit contact layers on different rows, are sequentially commonly connected. Specifically, taking notice of one bit line BL, the bit line contacts 35 thereof are arranged by a pitch four times as large as the pitch for the word lines WL. However, taking notice of the bit line contacts 35 along the row direction array of the trench capacitor TC, it is the same as the preceding preferred embodiments that three word lines WL are arranged between adjacent two of the bit line contacts 35.

In this preferred embodiment, by causing the bit lines BL to incline as described above, it is possible to adopt the folded bit line system wherein alternate bit lines BL are connected to the sense amplifier S/A as a pair. In addition, the design requirements in the directions of the word lines WL are moderated similar to the first preferred embodiment. Therefore, unlike the conventional $6F^2$ cell shown in FIG. 31, the bit lines BL can be provided by patterning one conductor film so that line/space=1F/1F and the pitch thereof is 2F, regardless of the inclined bit lines BL.

(Fourth Preferred Embodiment)

Figure 19:
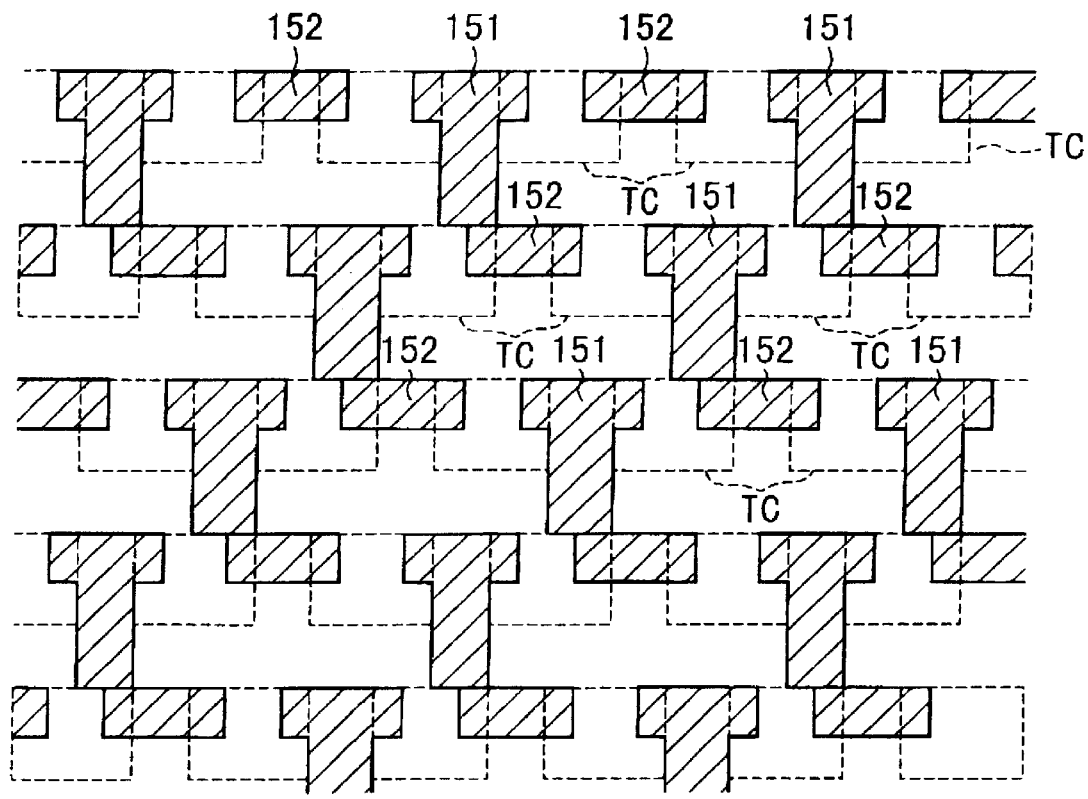
FIG. 19 is a diagram showing a layout in an element isolating insulator film forming process in the fourth preferred embodiment of a DRAM cell array according to the present invention.

FIG. 19 shows a modified example of the structure of the element isolating insulator film 15 shown in FIG. 16 on the basis of the third preferred embodiment. This is the same as the relationship between the first preferred embodiment and the second preferred embodiment. That is, in the fourth preferred embodiment, in order to more surely connect the transistors Q to trench capacitors TC, the element isolating insulator film 15 does not form a complete closed path, and comprises two kinds of patterns of a T-shaped pattern insulator film 151 and a rectangular pattern insulator film 152. The insulator film 151 is provided for surely isolating active regions 16 adjacent in the row directions and the column directions from each other. The insulator film 152 is provided for isolating the active regions 16 adjacent in the column directions from each other, and specifically, for isolating the central portions of the active regions 16, i.e., the bit line contact portions, from the capacitors of the active regions 16 adjacent thereto in the column directions.

Therefore, according to the fourth preferred embodiment, the side wall insulator film 14 of the trench capacitor TC is substituted for a part of the element isolating insulator film 15 crossing over the trench capacitor TC in the row directions, so that the contact area of the connecting conductor 33 to the capacitor node layer 13 can be greater than that in the third preferred embodiment. That is, it is possible to surely connect the transistor Q to the capacitor TC by the surface strap system with a low resistance.

(Fifth Preferred Embodiment)

According to the present invention, the three word lines WL are arranged between the adjacent bit line contacts 35 arranged in the row directions as described in each of the above described preferred embodiments. In addition, the connecting conductor 33 for connecting the transistor Q to the trench capacitor TC is formed in each of the spaces between the three word lines WL. If the same self-aligning contact technique as that for the bit line contact 35 is utilized for the connecting conductor 33, a lithography pattern which is open to straddle one word line WL can be used for burying two connecting conductors 33 formed on both sides of the word line WL.

Figure 20C:
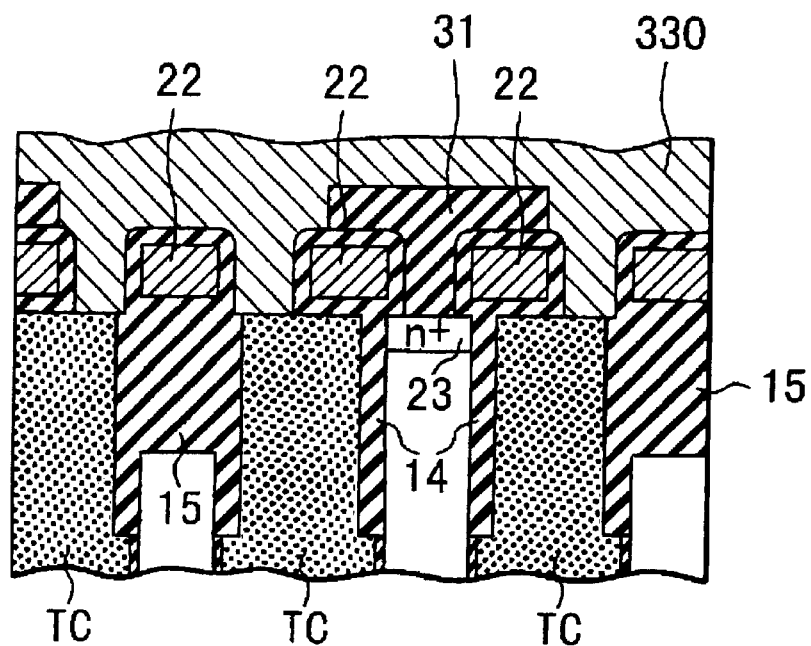
FIG. 20C is a sectional view showing a conducting film forming process for a connecting conductor in the fifth preferred embodiment.

Specifically, referring to FIGS. 20A through 20D, an example of a process for forming connecting conductors 33 on the layout structure of the third preferred embodiment, which has been described in and after FIG. 13, by the self-aligning contact technique will be described below. FIG. 20A shows a layout of a resist pattern 41 used for forming contact holes for the connecting conductors 33, and FIG. 20B is a sectional view taken along line A–A' thereof. As shown in the figures, a resist pattern 41 having openings 42, each of which straddles one word line WL, in the portions for burying two connecting conductors 33, which are arranged on both sides of the word line W, is formed.

By using this resist pattern, the interlayer insulator film 31 is etched. At this time, if the insulator film 25 for covering the gate electrode 22 is formed of a silicon nitride film and if the interlayer insulator film 31 is formed of a silicon oxide film, the opening for burying the connecting conductor can be formed between the gate electrodes 22 while being self-aligned to the gate electrodes 22 without allowing the gate electrodes 22 to be exposure.

Figure 20D:
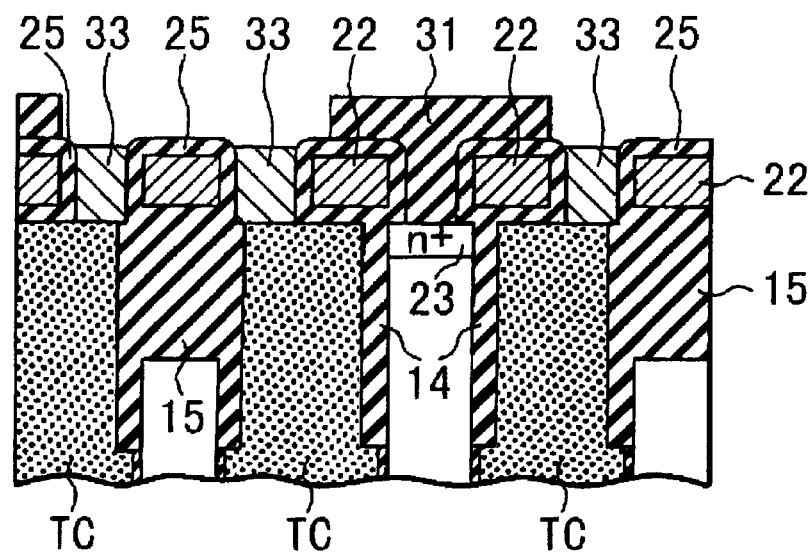
FIG. 20D is a sectional view showing a connecting conductor burying process in the fifth preferred embodiment.

FIG. 20C is a sectional view showing the subsequent state that a conductor film 330 for the connecting conductor 33 is deposited. By etching back the conductor film 330, it is possible to bury the connecting conductor 33 between the gate electrodes 22 as shown in FIG. 20D.

According to this preferred embodiment, it is possible to improve the workability using the lithography, and it is possible to improve the reliability of the connection of the transistor Q to the trench capacitor TC by the surface strap system.

The same self-aligning contact technique can be applied to the connecting conductor 33 in other preferred embodiments 1, 2 and 4.

Referring to FIGS. 20E through 20I, another method for producing the above described third preferred embodiment of a semiconductor device according to the present invention will be described below.

Figure 20E:
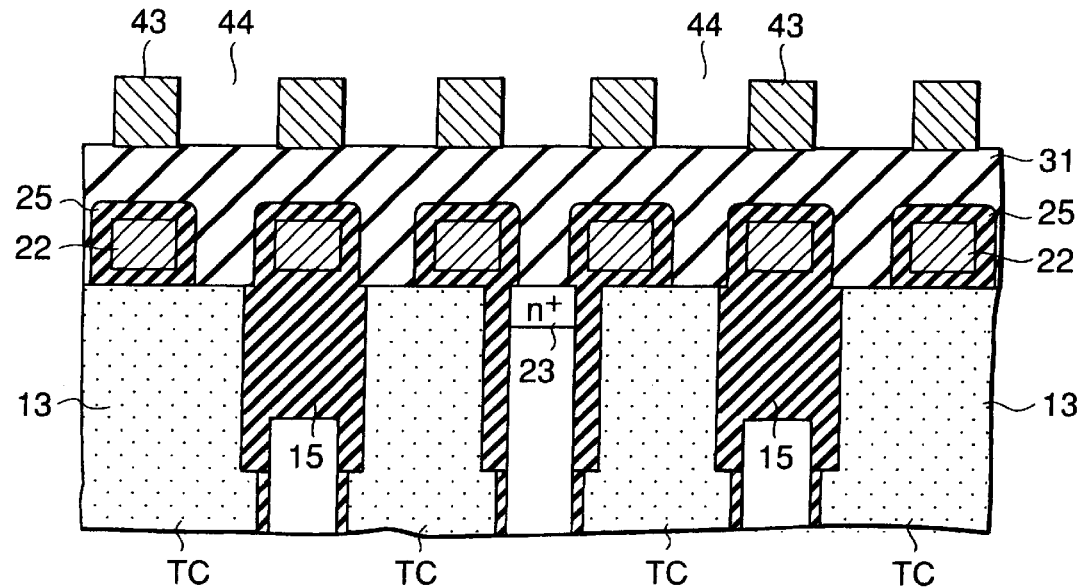
FIG. 20E is a sectional view showing a modified example of a process for a connecting conductor and a bit line contact in the fifth preferred embodiment.

As shown in FIG. 20E, a resist pattern 43 is formed on an interlayer insulator film 31 of an oxide film. This resist pattern 43 has an opening 42.

Figure 20F:
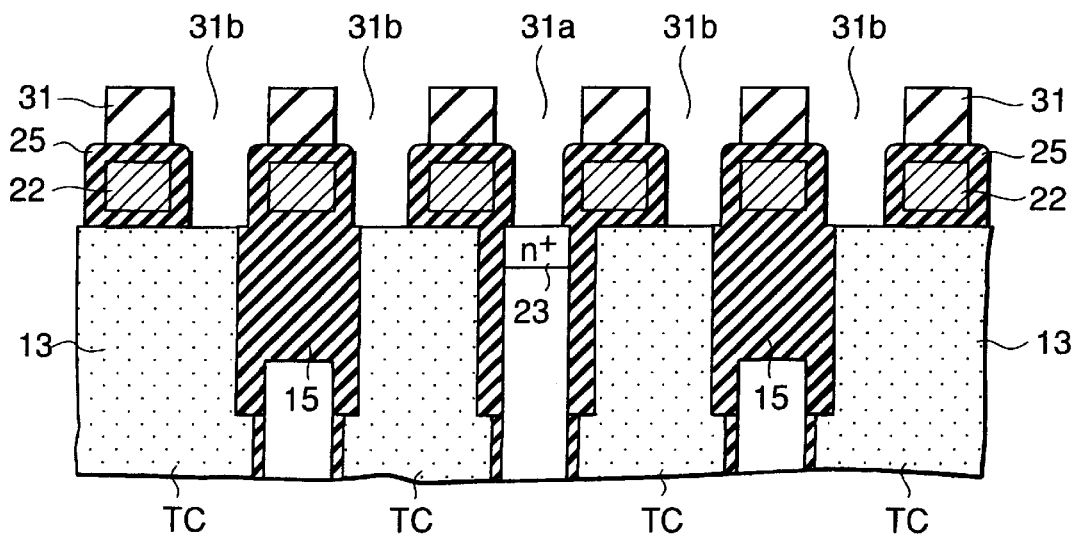
FIG. 20F is a sectional view showing a modified example of a process for a connecting conductor and a bit line contact in the fifth preferred embodiment.

Then, as shown in FIG. 20F, the resist pattern 43 is used as a mask to etch the interlayer insulator film 31 by, e.g., the RIE, to form an opening 31a. That is, the opening 31a for the bit line contact and an opening 31b for a connecting conductor 33 are simultaneously formed. Subsequently, the resist pattern 43 is removed.

Figure 20G:
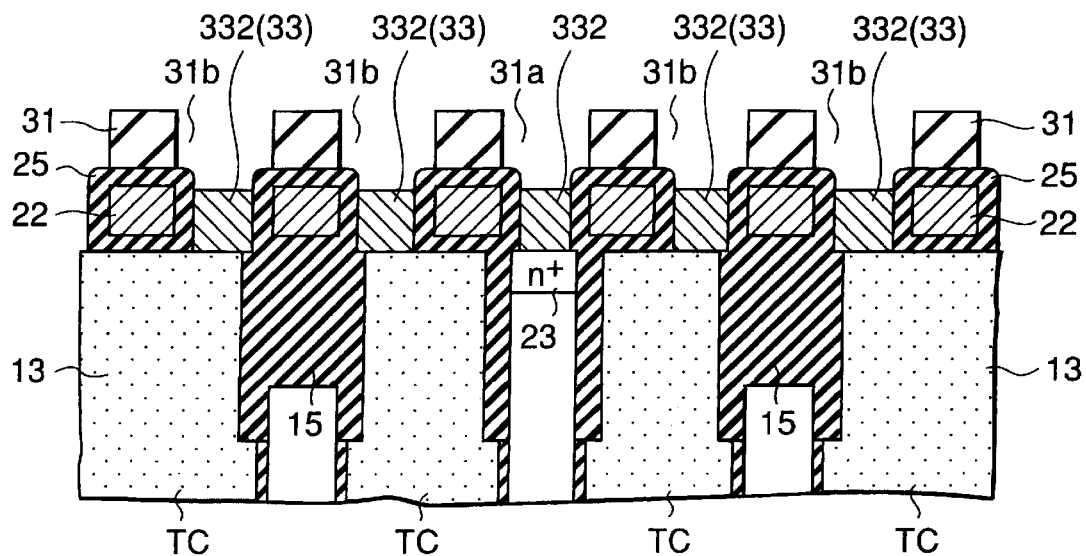
FIG. 20G is a sectional view showing a modified example of a process for a connecting conductor and a bit line contact in the fifth preferred embodiment.
Figure 20H:
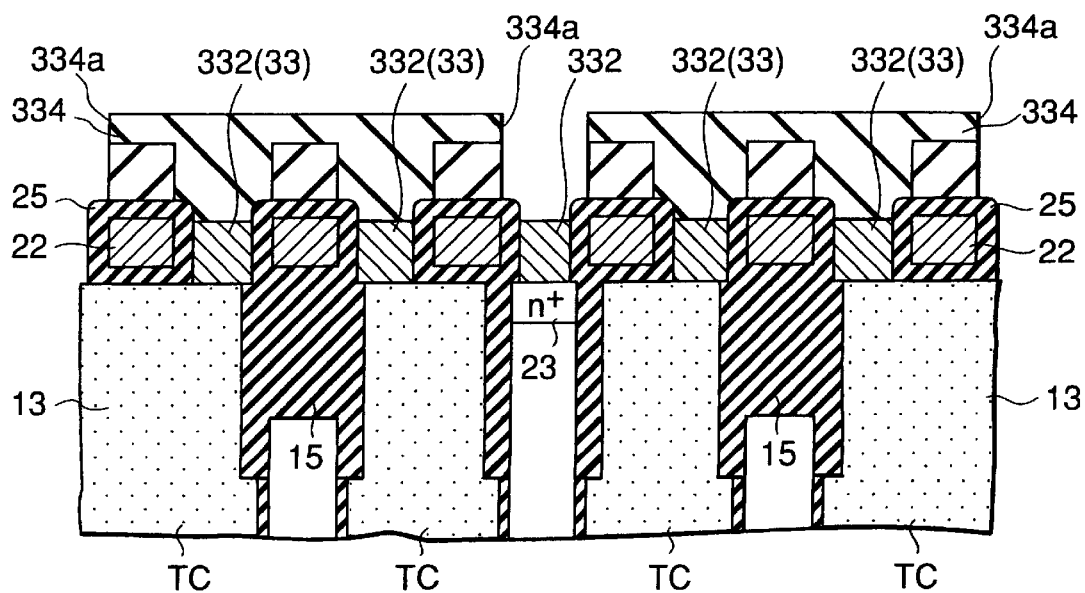
FIG. 20H is a sectional view showing a modified example of a process for a connecting conductor and a bit line contact in the fifth preferred embodiment.
Figure 20:
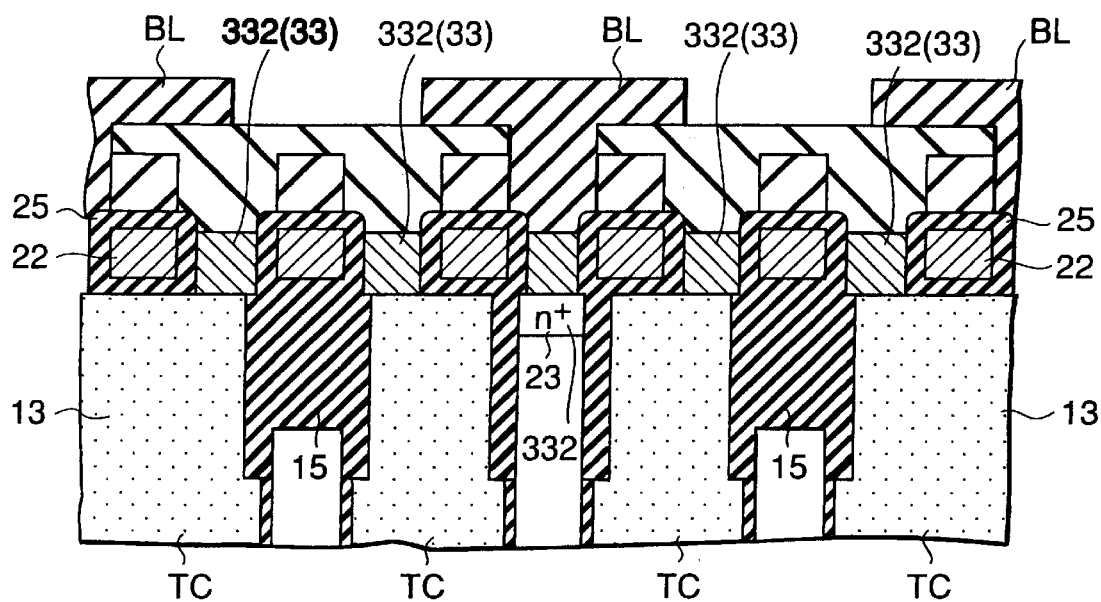
FIG. 20A is a diagram showing a resist pattern for forming a connecting conductor in the fifth preferred embodiment of the present invention.
FIG. 20B is a sectional view taken along line A–A' of FIG. 20A.
FIG. 20I is a sectional view showing a modified example of a process for a connecting conductor and a bit line contact in the fifth preferred embodiment.

Then, as shown in FIG. 20G, conductor layers 332 are formed on the bottoms of the openings 31a and 31b. For example, the conductor layer 332 is formed by depositing a polysilicon, in which an impurity is doped by the CVD method, or by growing an epitaxial layer by the epitaxial growth method. Of the conductive layers 332, the conductive layer 332 formed in the opening 31a serves as a part of a bit line contact 35, and the conductive layer 332 formed in the opening 31b serves as the connecting conductor 33. Then, as shown in FIG. 20H, an oxide film is deposited so as to fill in the openings 31a and 31b of the interlayer insulator film 31, and the surface thereof is flattened by the CMP or the like to form a second interlayer insulator film 334. Subsequently, a resist pattern is used to form an opening 334a for the bit line contact 35 of the interlayer insulator film 334.

Then, as shown in FIG. 20I, a conductor layer of a metal or the like is deposited so as to fill in the opening 334a, and patterned as shown in FIG. 13 to form a bit line BL. When the bit line BL is formed, the line/space of the bit line BL is 1F/1F as shown in FIG. 13, so that the bit line BL can be formed by depositing only one conductor layer. The bit line BL is connected to the diffusion layer 23 via the conductor layer 32.

(Sixth Preferred Embodiment)

Figure 21:
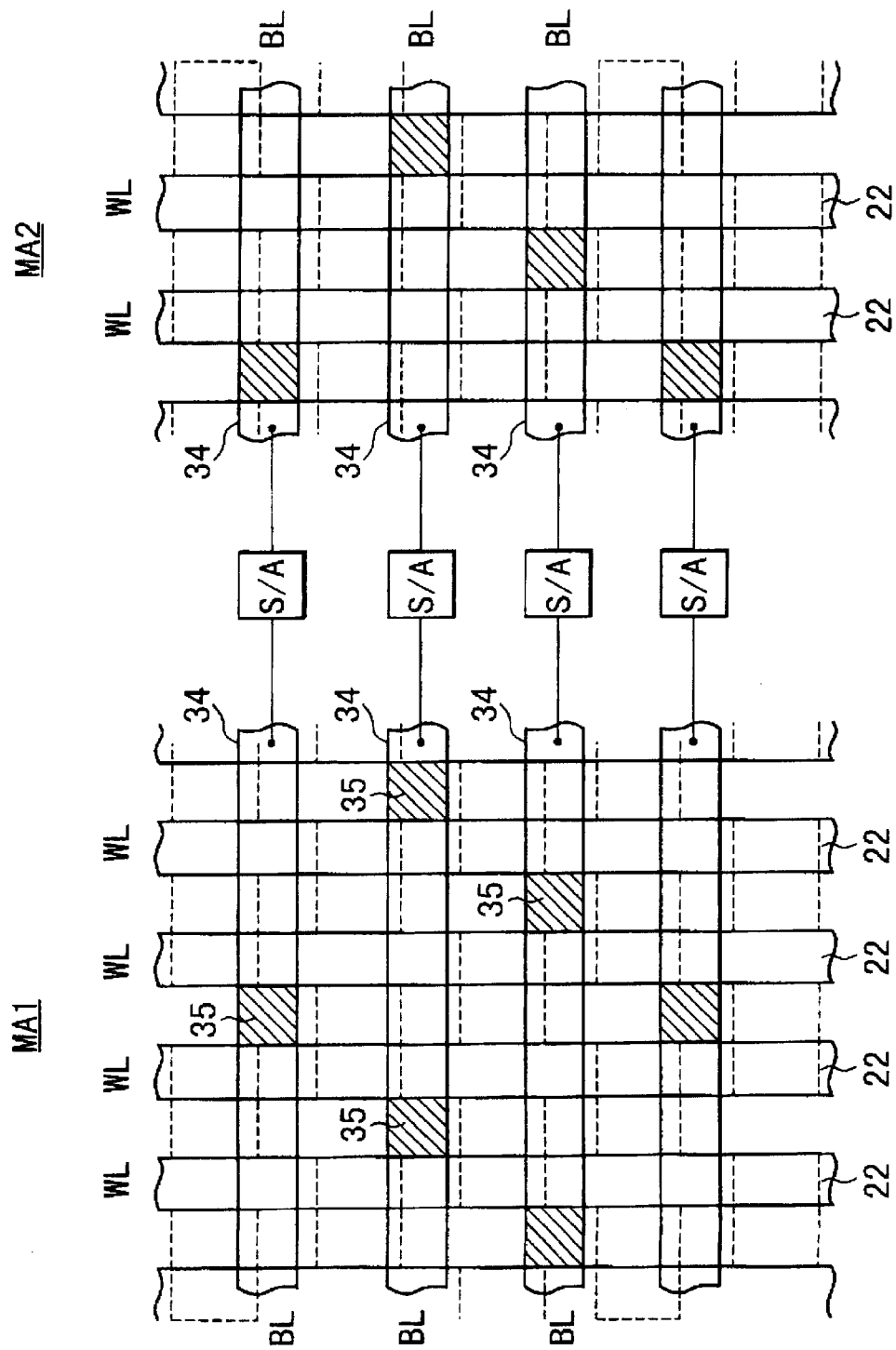
FIG. 21 is a diagram showing a layout of the sixth preferred embodiment of a DRAM cell array according to the present invention.

To the third and fourth preferred embodiments shown in FIGS. 13 through 19, the folded bit line system has been applied by inclining the bit lines (BL) 34. On the other hand, the layout of the trench capacitors TC and word lines WL in the third and fourth preferred embodiments is used as it is, and only the bit line layout is changed, so that the sense amplifier system can be the open bit line system. FIG. 21 shows such a layout in the sixth preferred embodiment, which corresponds to FIG. 13.

As shown in FIG. 21, bit lines (BL) 34 are provided so as to commonly connect bit line contacts, which are arranged in the row directions, to be perpendicular to word lines WL. In addition, a corresponding pair of bit lines BL are connected to a sense amplifier S/A between adjacent cell arrays MA1 and MA2 to provide the open bit line system.

In this preferred embodiment, the space between adjacent bit lines can be greater than that in the third and fourth preferred embodiments wherein the bit lines are inclined, so that it is possible to easily work the bit lines.

(Seventh Preferred Embodiment)

In the third and fourth preferred embodiments shown in FIGS. 13 through 19, alternate bit lines BL are used as a pair to apply the folded bit line system by inclining the bit lines (BL). In this case, the folded bit line system may be combined with the open bit line system. FIG. 22 is an equivalent circuit of a such a combined system in the seventh preferred embodiment.

That is, in FIG. 22, there is used the folded bit line system using a pair of bit lines in memory cell arrays MA1 and MA2 with respect to sense amplifier columns 51 and 52 arranged on both sides of the two memory cell array MA1 and MA2. A sense amplifier column 53 arranged between the memory arrays MA1 and MA2 uses the open amplifier system using a pair of bit lines corresponding to the memory cell array MA1 and MA2.

By using such a combined sense amplifier system, it is possible to perform a data reading operation with low noises.

(Eighth Preferred Embodiment)

Figure 23:
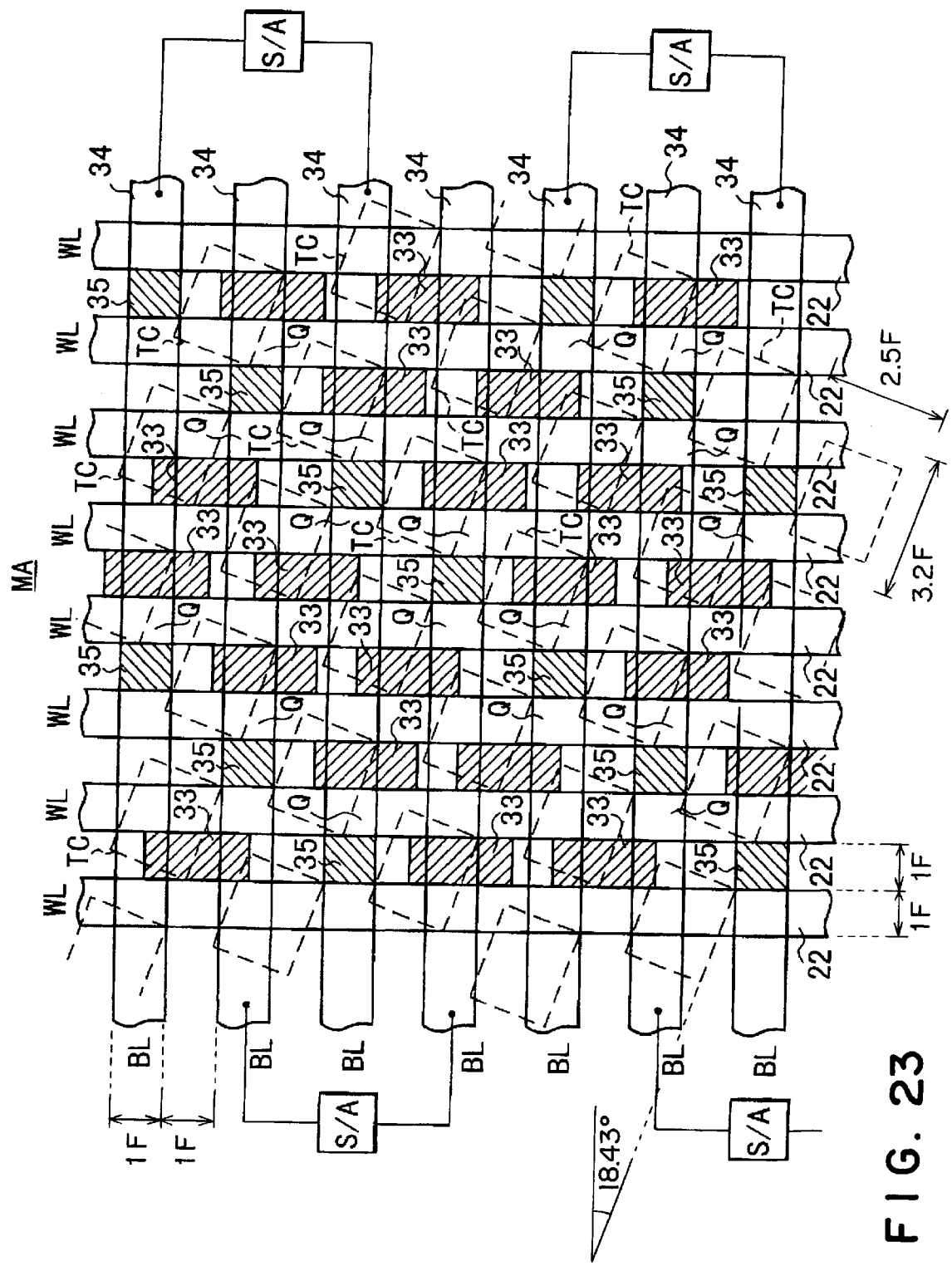
FIG. 23 is a diagram showing a layout of the eighth preferred embodiment of a DRAM sell array according to the present invention.

FIG. 23 shows a layout of the eight preferred embodiment of a DRAM cell according to the present invention. This preferred embodiment is the same as the third preferred embodiment of FIG. 13 at the point that the bit lines (BL) are inclined with respect to the array direction of the trench capacitors TC so that the bit line contact layers 35 having different trench capacitor arrays are commonly connected.

The array of the trench capacitors TC is necessarily determined by the positions of the bit line contacts 35. That is, when the bit lines BL and the word lines WL are provided so that the line/space is 1F/1F as shown in FIG. 23, the positions of the bit line contacts 35 are univocally determined as shown in the figure. With respect to each of the bit line contacts 35 thus determined, the trench capacitor TC is arranged so as to form the trench capacitor TC on both sides. Moreover, when alternate bit lines BL are connected to each other by the folded bit line system, the trench capacitors TC are inclined so as to prevent data from being read out of two trench capacitors to the bit line BL when one word line WL is turned on.

In this preferred embodiment, the array of the trench capacitors TC has a pitch of 3.2F in the row directions and a pitch of 2.5F in the column directions, so that the array occupied by a unit memory cell is $3.2F \times 2.5F = 8F^2$. In addition, the inclination of the trench capacitor TC is 18.43 degree with respect to horizontal directions in the figure.

The element isolating insulator film has the same layout as that in FIG. 16 or 19.

Although four word lines WL are arranged between adjacent bit line contacts 35 taking notice of one bit line BL, three word lines WL are arranged between adjacent bit line contacts 35 along the array of the trench capacitor TC in the row directions. This point is the same as each of the preceding preferred embodiments.

In addition, in this preferred embodiment, as shown in the figure, the connection of the sense amplifier S/A is performed by the folded bit line system for connecting a pair of alternate bit lines BL to two nodes of the sense amplifier S/A, similar to the third preferred embodiment. Thus, it is possible to perform a low-noise sense operation. However, it is also possible to perform the sense amplifier connection of the open bit line system between two memory cell arrays.

Figure 23A:
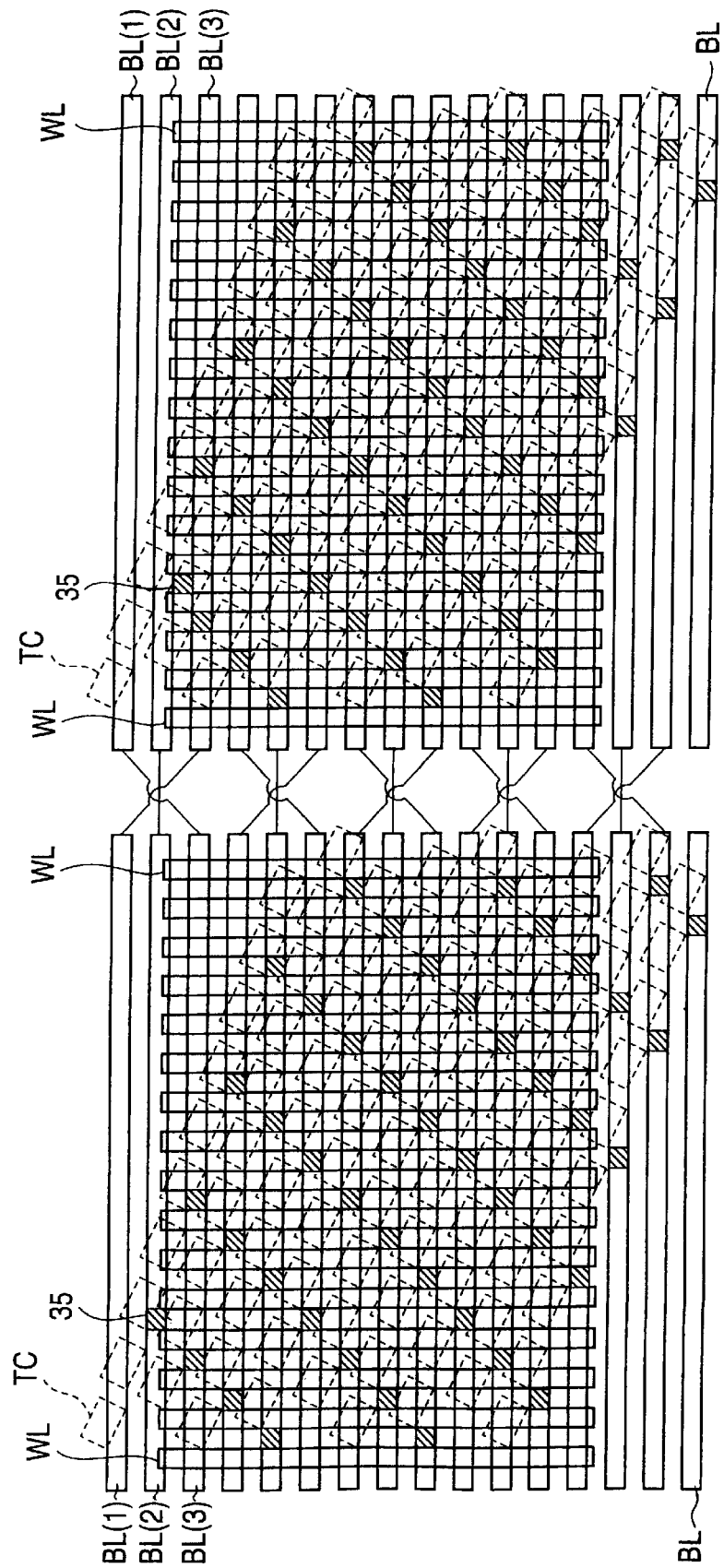
FIG. 23A is a connection diagram wherein bit lines of the DRAM cell array in the eighth preferred embodiment are connected so as to be twisted.

Moreover, as shown in FIG. 23A, the bit lines BL may be twisted to be connected to each other. That is, the bit line BL(1) on the left in the figure is connected to the bit line BL(3) on the right in the figure, the bit line BL(2) on the left in the figure is connected to the bit line BL(2) on the right in the figure, and the bit line BL(3) on the left in the figure is connected to the bit line BL(1) on the right in the figure. By thus twisting and connecting the bit lines BL to each other, it is possible to cancel noises produced in the bit lines BL.

(Ninth Preferred Embodiment)

Figure 24:
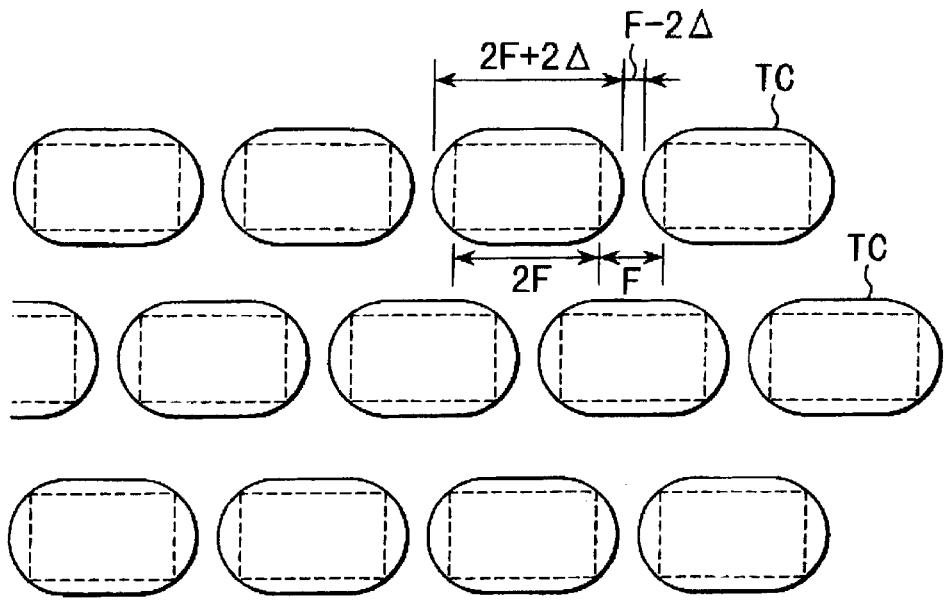
FIG. 24 is a diagram showing a design layout and actual layout of a trench capacitor in the first preferred embodiment.

In the preceding preferred embodiments, the array of the trench capacitors TC has a constant width and a constant space. However, in the actual DRAM production, it is not possible to avoid the fluctuation in width and space in design by working conditions. For example, in FIG. 24, the array in design of the trench capacitors TC corresponding to the first preferred embodiment is shown by broken lines, and the actual shapes of the trench capacitors TC on a wafer are shown by solid lines. In this case, the design width and space of the trench capacitor TC are 2F and F, respectively, whereas the actual width and space thereof are $2F+2\Delta$ and $F-2\Delta$, respectively. If the space is thus decreased, the region for the bit line contacts 35 is particularly narrowed, so that there is some possibility that it is difficult to work the bit line contacts 35.

Figure 25:
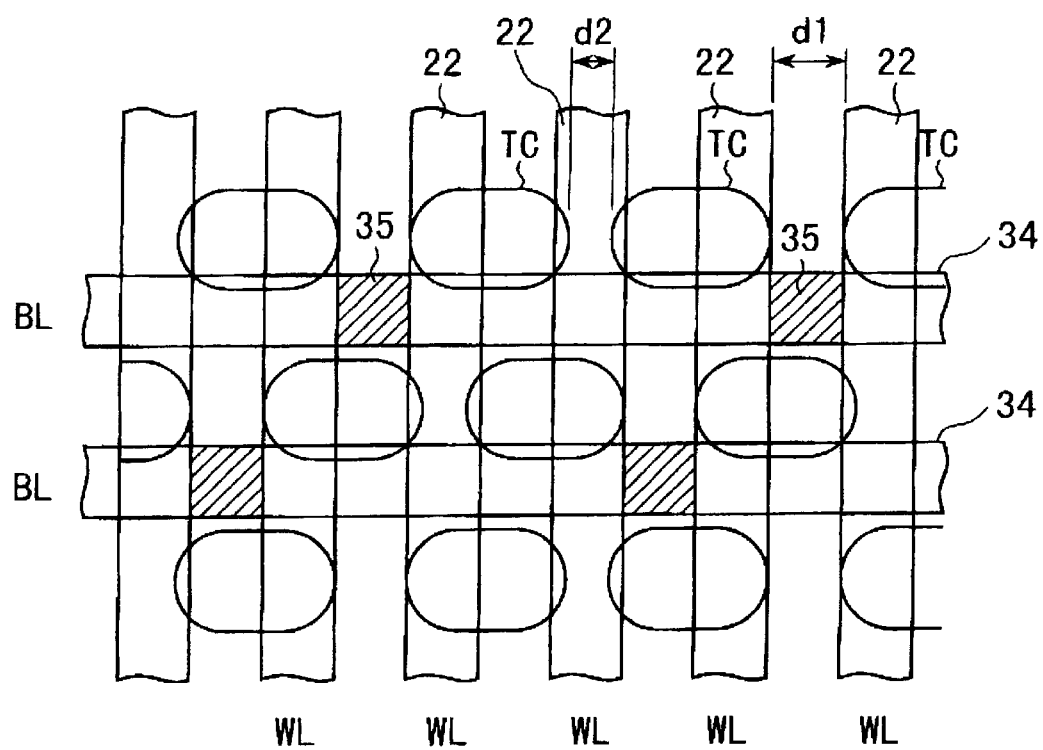
FIG. 25 is a diagram showing a layout of the ninth preferred embodiment of a DRAM cell array according to the present invention.

In the ninth preferred embodiment taking account of this point, the space for a portion adjacent to the bit line contact 35, of the space for the array of the trench capacitors TC in the row directions, is set to be greater than other spaces. FIG. 25 shows a layout of DRAM cells in the ninth preferred embodiment. The basic layout is the same as that in the first preferred embodiment shown in FIG. 1, except that the space for a portion adjacent to the bit line contacts 35 is set to be d1 and other spaces are set to be d2, here d1>d2.

Figure 26:
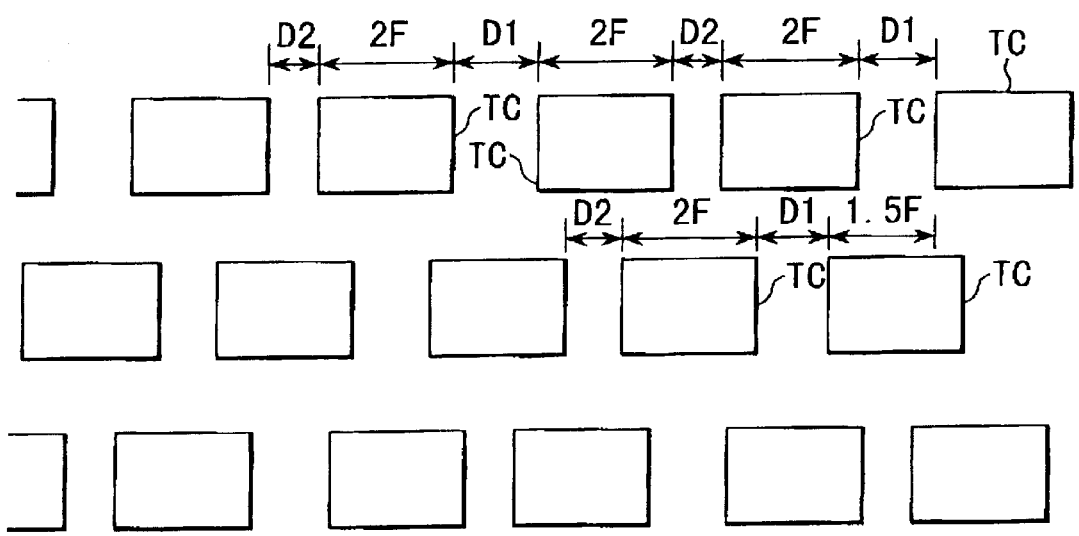
FIG. 26 is a diagram showing a design layout for obtaining the layout of FIG. 25.

Although FIG. 25 shows the actual shape of the trench capacitors TC on the wafer, the design shape of trench capacitors TC is shown in FIG. 26. That is, the width of the trench capacitor TC is set to be 2F, the space for a portion adjacent the bit line contacts 35 is set to be D1, and other spaces are set to be D2, D1>D2. In order to hold the same row-direction array pitch, 3F, as the first preferred embodiment, it has only to set $D1=F-\Delta F$ and $D2=F+\Delta F$.

By such a design, it is possible to surely ensure the regions for the bit line contacts 35. The same design change can be allowed for the second through eighth preferred embodiments.

(Tenth Preferred Embodiment)

According to the present invention, as described in the preceding preferred embodiments, the element isolating insulator film 15 is formed so as to surround one active region 16 and a part of trench capacitors TC adjacent thereto. However, in the preceding preferred embodiments, the element isolating insulator film 15 is arranged so that the edge thereof is coincident with the edges of the trench capacitors TC as shown in, e.g., FIG. 16.

Figure 27:
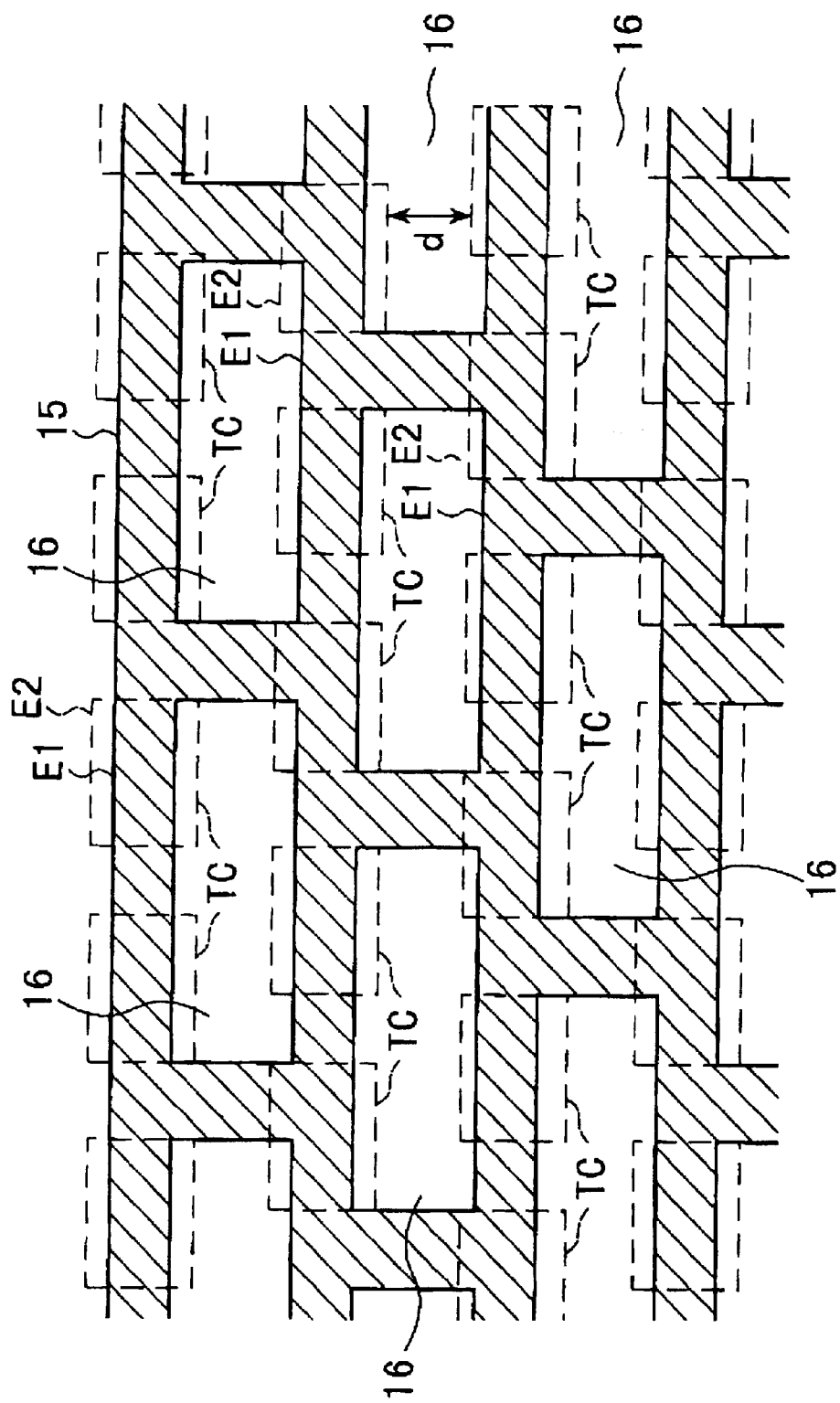
FIG. 27 is a diagram showing a layout of a capacitor and element isolating insulator film during the element isolating insulator recessing in the tenth preferred embodiment of the present invention.

On the other hand, FIG. 27 shows a layout of an element isolating insulator film 15 in the tenth preferred embodiment wherein the layout of FIG. 16 is modified.

In this preferred embodiment, the edge El of the element isolating insulator film 15 is shifted from the edge E2 of the trench capacitor TC inside of the trench capacitor TC. That is, the element isolating insulator film 15 is arranged so as to substantially cross the central portion of the trench capacitor TC.

Figure 27A:
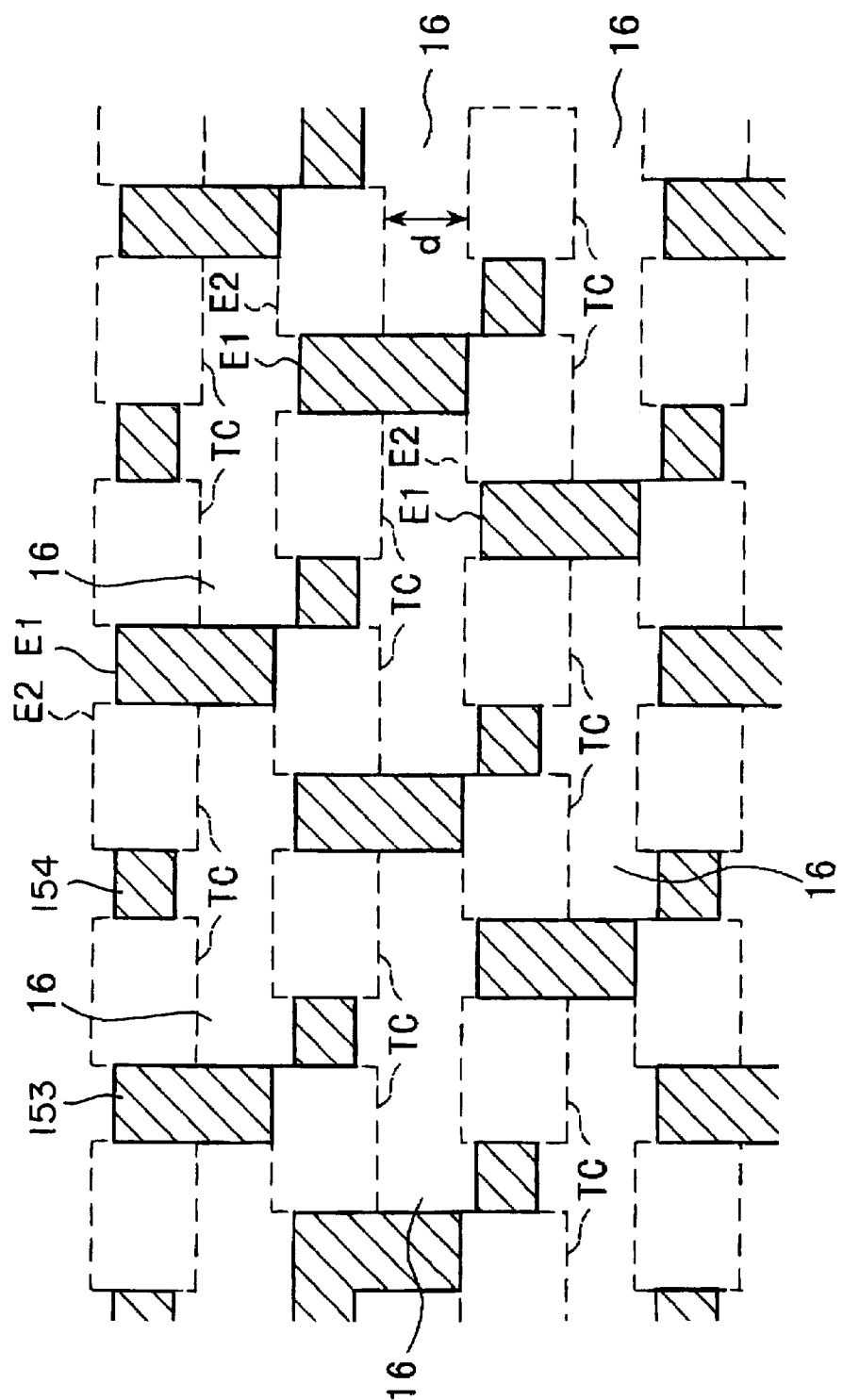
FIG. 27A is a diagram showing a layout (⅓ pitch) after an element isolating insulator film is formed in the tenth preferred embodiment.
Figure 28:
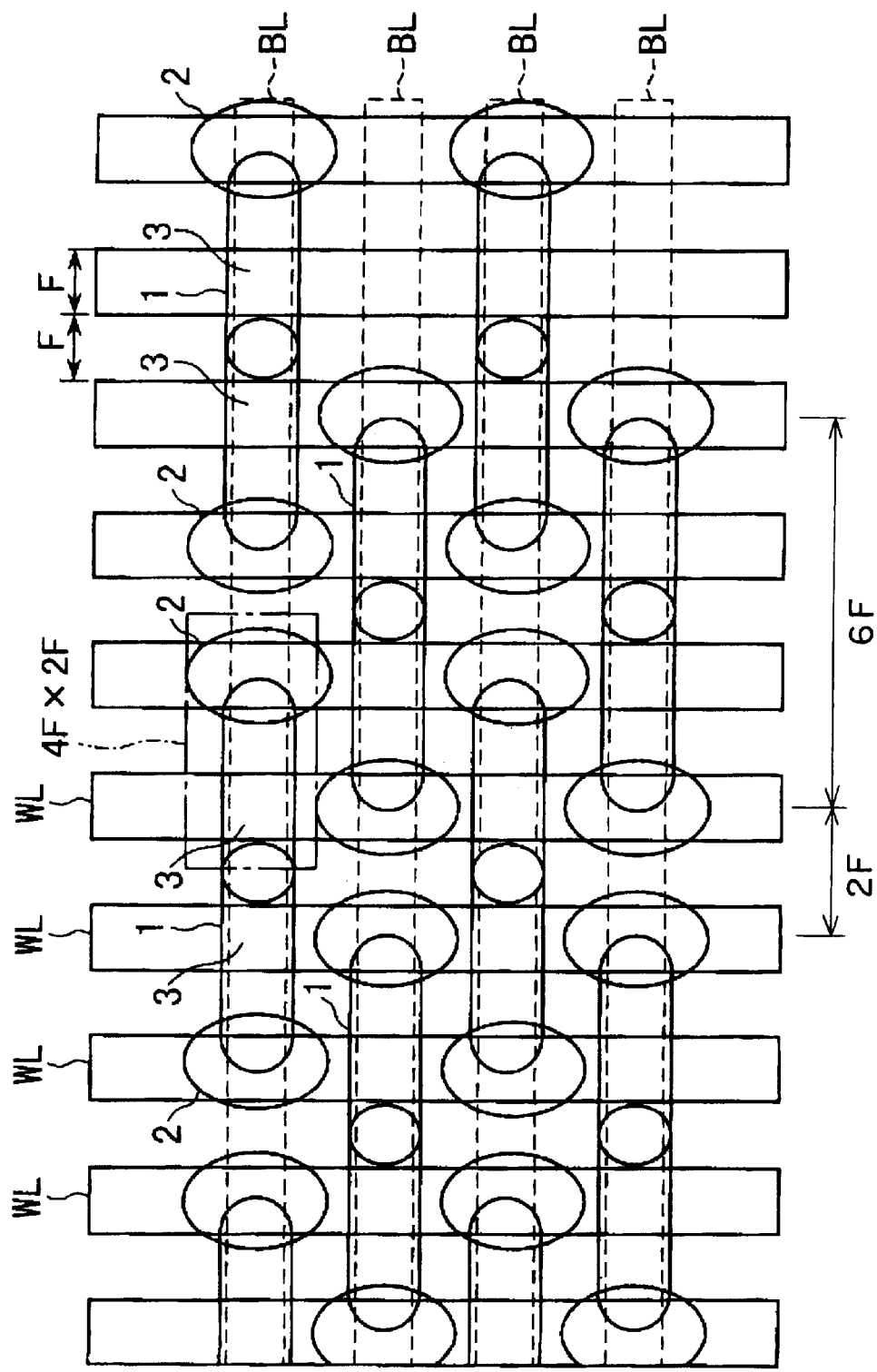
FIG. 28 is a diagram of a layout of a conventional DRAM cell array.

In this case, as compared with FIG. 16, the area of the surface strap for connecting the capacitor node layer 13 to the transistor diffusion layer decreases in layout. However, this problem is solved by selecting working conditions so that grooves are not formed above the trench capacitors TC during the element isolating insulator recessing using the STI technique. That is, although the design layout of the element isolating insulator film 15 is made as shown in FIG. 27, no groove is actually formed in the regions for the trench capacitors TC. Therefore, as shown in FIG. 27A, it is possible to prevent the element isolating insulator film 15 from being formed in the regions for the trench capacitors TC. Thus, it is possible to ensure the area of the surface strap on the trench capacitors TC.

In the layout shown in FIG. 27A, the trench capacitors TC are formed in portions of the surrounding portions of the active regions 16, in which no element isolating insulator film 15 is formed. Therefore, the isolation between the active regions 16 is formed by the insulator films 153, 154 and the side wall insulator films 14 (e.g., FIG. 2A) on the side walls of the trench capacitors TC.

If the layout in this preferred embodiment is adopted, the channel width of the MOS transistor Q, which will be formed in the active region 16 later, is determined by the distance d between edges of the transistor capacitors TC adjacent to each other in the column directions. That is, even if the element isolating insulator film 15 is slightly shifted from the trench capacitor TC, it is possible to inhibit the fluctuation in channel width of the MOS transistor Q.

Furthermore, while FIG. 27 has been shown as a modified example of the layout of FIG. 16, the same modification can be applied to other preferred embodiments, e.g., the layout of the trench capacitor TC and element isolating insulator film shown in FIGS. 5 and 11. If this modified example is applied to the trench capacitors TC shown in FIGS. 5 and 11, the layout shown in FIG. 27B is obtained.

As described above, according to the present invention, it is possible to realize a layout capable of decreasing the area occupied by a unit memory cell while ensuring the capacity of a capacitor in a DRAM cell array of a trench capacitor system, and it is possible to surely connect transistors to trench capacitors by the surface strap system.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:

a semiconductor substrate;

a plurality of trench capacitors arranged on said semiconductor substrate in the form of a matrix at a substantially constant pitch in row directions and said trench capacitors being sequentially shifted between adjacent rows by a predetermined pitch;

an element isolating insulator film formed so as to surround active regions, each of which is adjacent to two trench capacitors of said trench capacitors adjacent to each other in said row directions, said element isolating insulator film including a partial region of said two trench capacitors;

a plurality of transistors, each of which is formed in each of said active regions and each of which has source diffusion layer and drain diffusion layer, one of said source diffusion layer and drain diffusion layer being connected to a capacitor node layer of a corresponding one of said trench capacitors via a connecting conductor formed on said semiconductor substrate, and the other of said source diffusion layer and drain diffusion layer serving as one of bit line contact layers, which is shared by two transistors of said transistors adjacent to each other in said row directions;

a plurality of word lines, every three of which are arranged between adjacent two of said bit line contact layers arranged in said row directions so as to commonly connect gate electrodes of said transistors arranged in directions intersecting said row directions to each other; and a plurality of bit lines for commonly connecting said bit line contact layers in directions intersecting said word lines.

2. A semiconductor memory device as set forth in claim 1, wherein said trench capacitors are arranged in the form of a matrix at a constant pitch in said row directions and said trench capacitors are sequentially shifted between adjacent rows by ½ pitches.

3. A semiconductor memory device as set forth in claim 2, wherein assuming that the minimum working dimension is F, the width and space of an array of said trench capacitors in said row directions are set to be 2F and F, respectively, and the line/space of said word lines is set to be 1F/1F.

4. A semiconductor memory device as set forth in claim 3, wherein an array pitch of said trench capacitors in column directions is set to be in the range of 2.5F through 3F.

5. A semiconductor memory device as set forth in claim 2, wherein said bit lines are formed by patterning a conductor layer and provided so as to commonly connect said bit line contact layers on the same row, said bit lines being connected to a sense amplifier by an open bit line system.

6. A semiconductor memory device as set forth in claim 2, wherein said bit lines are inclined with respect to said row directions to be provided so as to commonly connect said bit line contact layers on different rows, said bit lines being connected to a sense amplifier by a folded bit line system.

7. A semiconductor memory device as set forth in claim 1, wherein said trench capacitors are arranged in the form of a matrix at a constant pitch in said row directions and said trench capacitors are sequentially shifted between adjacent rows by ⅓ pitches.

8. A semiconductor memory device as set forth in claim 7, wherein assuming that the minimum working dimension is F, the width and space of an array of said trench capacitors in said row directions are set to be 2F and F, respectively, and the line/space of said word lines is set to be 1F/1F.

9. A semiconductor memory device as set forth in claim 8, wherein an array pitch of said trench capacitors in column directions is set to be in the range of 2.5F through 3F.

10. A semiconductor memory device as set forth in claim 7, wherein said bit lines are formed by patterning a conductor layer and provided so as to commonly connect said bit line contact layers on the same row, said bit lines being connected to a sense amplifier by an open bit line system.

11. A semiconductor memory device as set forth in claim 1, wherein said bit lines are inclined with respect to said row directions to be provided so as to commonly connect said bit line contact layers on different rows, said word lines are perpendicular to bit lines.

12. A semiconductor memory device as set forth in claim 1, wherein a space for a portion adjacent to said bit line contact layers, of a space for an array of said trench capacitors in said row directions, is set to be greater than other spaces.

13. A semiconductor memory device as set forth in claim 1, wherein said element isolating insulator film surrounding said active regions does not form a complete closed path, and one of said trench capacitors for one memory cell is partially separated from one of said active regions for a memory cell, which is adjacent to said one of said trench capacitors in said row directions, by a side wall insulator film of said one of said trench capacitors.

14. A semiconductor memory device as set forth in claim 1, wherein said connecting conductor is self-aligned to said word lines to be buried between adjacent two of said word lines.

15. A semiconductor memory device comprising:
   a semiconductor substrate;
   a plurality of trench capacitors arranged on said semiconductor substrate in the form of a matrix at a substantially constant pitch in row directions and said trench capacitors being sequentially shifted between adjacent rows by a predetermined pitch;
   an element isolating insulator film which forms active regions, each of said active region being adjacent to a pair of said trench capacitors in said row directions every adjacent two of said trench capacitors, and which constitutes at least part of an adjacent isolating wall for electrically separating said active regions from each other, said active regions being formed so as to extend in said row directions and being adjacent to said, pair of said trench capacitors in said row directions;
   a plurality of pair transistors, each of which has one bit line contact layer and two capacitor contact layers, said bit line contact layer being formed between said pair of said trench capacitors so as to be adjacent to said pair of said trench capacitors, said two capacitor contact layers being formed on both sides of said one of said active regions, and channels being formed between said bit line contact layer and said capacitor contact layers;
   a plurality of connecting conductors, each of which connects said capacitor contact layer to a corresponding one of said trench capacitors;
   a plurality of word lines continuously formed so as to commonly connect above said channels in said pair transistor arranged in first directions intersecting said row directions, every three of said word lines being arranged between adjacent two of said bit line contact layers in said row directions; and
   a plurality of bit lines continuously formed so as to commonly connect said bit line contact layers arranged in second directions intersecting said word lines.

16. A semiconductor memory device as set forth in claim 15, wherein said second directions are substantially parallel to said row directions, and said bit lines are formed in said row directions so as to commonly connect said bit line contact layers arranged in said row directions.

17. A semiconductor memory device as set forth in claim 16, wherein said trench capacitors are arranged in the form of a matrix and said trench capacitors are sequentially shifted between adjacent rows by ½ pitches, and
   wherein assuming that the minimum working dimension is F, the width and space of an array of said trench capacitors in said row directions are set to be 2F and F, respectively, and the line/space of said word lines is set to be 1F/1F.

18. A semiconductor memory device as set forth in claim 17, wherein an array pitch of said trench capacitors in column directions is set to be in the range of 2.5F through 3F.

19. A semiconductor memory device as set forth in claim 18, wherein said element isolating insulator film is continuously formed so as to surround said active regions, said adjacent isolating wall being formed of said element isolating insulator film,
   wherein a side of said element isolating insulator film extending in said row directions is formed so as to extend along and overlap with a side, which extends in said row directions, of said trench capacitors, and
   wherein both sides of said element isolating insulator film extending in said column directions are formed between adjacent two of said trench capacitors, in which said bit line contact layers are not formed, so as to extend along and overlap with both sides, which extend in said column directions, of said adjacent two of said trench capacitors.

20. A semiconductor memory device as set forth in claim 18, wherein said element isolating insulator film includes:
   a first insulator film, formed between adjacent two of said trench capacitors, in which said bit line contact layers are not formed, for ensuring electrical insulation in said active regions in said row and column directions; and
   a second insulator film, formed between adjacent two of said trench capacitors, in which said bit line contact layers are formed, for ensuring electrical insulation in said active regions in said column directions, said adjacent isolating wall comprising said first and second insulator films and a side wall insulator film of said trench capacitors, and
   wherein both sides of said first insulator film extending in said column directions are formed so as to extend along and overlap with both sides, which extend in said column directions, of said adjacent two of said trench capacitors, in which said bit line contact layers are not formed, and
   a side of said second insulator film extending in said row directions is formed so as to extend along and overlap with a side, which extends in row directions, of said trench capacitors.

21. A semiconductor memory device as set forth in claim 15, wherein said second directions are inclined with respect to said row directions, and said bit lines are formed so as to commonly connect said bit line contact layers on different rows.

22. A semiconductor memory device as set forth in claim 21, wherein said trench capacitors are arranged in the form of a matrix and said trench capacitors are sequentially shifted between adjacent rows in said column directions by 1/3 pitches, wherein assuming that the minimum working dimension is F, the width and space of an array of said trench capacitors in said row directions are set to be 2F and F, respectively, and wherein the line/space of said word lines is set to be 1F/1F, and the line/space of said bit lines is set to be 1F/1F.

23. A semiconductor memory device as set forth in claim 22, wherein an array pitch of said trench capacitors in said column directions is set to be in the range of 2.5F through 3F.

24. A semiconductor memory device as set forth in claim 23, wherein said element isolating insulator film is continuously formed so as to surround said active regions, said adjacent isolating wall being formed of said element isolating insulator film, wherein a side of said element isolating insulator film extending in said row directions is formed so as to extend along and overlap with a side, which extends in said row directions, of said trench capacitors, and wherein both sides of said element isolating insulator film extending in said column directions are formed between adjacent two of said trench capacitors, in which said bit line contact layers are not formed, so as to extend along and overlap with both sides, which extend in said column directions, of said adjacent two of said trench capacitors.

25. A semiconductor memory device as set forth in claim 23, wherein said element isolating insulator film includes:

a first insulator film, formed between adjacent two of said trench capacitors, in which said bit line contact layers are not formed, for ensuring electrical insulation in said active regions in said row and column directions; and a second insulator film, formed between adjacent two of said trench capacitors, in which said bit line contact layers are formed, for ensuring electrical insulation in said active regions in said column directions, said adjacent isolating wall comprising said first and second insulator films and a side wall insulator film of said trench capacitors, and wherein both sides of said first insulator film extending in said column directions are formed so as to extend along and overlap with both sides, which extend in said column directions, of said adjacent two of said trench capacitors, in which said bit line contact layers are not formed, and a side of said second insulator film extending in said row directions is formed so as to extend along and overlap with a side, which extends in row directions, of said trench capacitors.

26. A semiconductor memory device as set forth in claim 15, wherein said second directions are substantially parallel to said row directions, said trench capacitors are arranged in the form of a matrix and said trench capacitors are sequentially shifted between adjacent rows by 1/3 pitches, assuming that the minimum working dimension is F, the width and space of an array of said trench capacitors in said row directions are set to be 2F and F, respectively, and the line/space of said word lines is set to be 1F/1F, the line of said bit lines is set to be 1F, and the space of said bit lines is greater than 1F.

27. A semiconductor memory device as set forth in claim 15, wherein:

said first directions are inclined with respect to said column directions, said second directions are inclined with respect to said row directions, assuming that the minimum working dimension is F, the width and space of an array of said trench capacitors in said row directions are set to be 2F and F, respectively, and the line/space of said word lines is set to be 1F/1F, and the line/space of said bit lines is set to be 1F/1F.

28. A semiconductor memory device as set forth in claim 15, wherein said element isolating insulator film includes:

a first insulator film, formed between adjacent two of said trench capacitors, in which said bit line contact layers are not formed, for ensuring electrical insulation in said active regions in said row and column directions; and a second insulator film, formed between adjacent two of said trench capacitors, in which said bit line contact layers, for ensuring electrical insulation in said active regions in said column directions, said adjacent isolating wall comprising said first and second insulator films and a side wall insulator film of said trench capacitors, and wherein both sides of said first insulator film extending in said column directions are formed so as to extend along and overlap with both sides, which extend in said column directions, of said adjacent two of said trench capacitors, in which said bit line contact layers are not formed, a side of said first insulator film extending in said row directions is formed so as to extend along said row directions between both sides, which extend in said row directions, of said trench capacitors, in which said bit line contact layers are not formed, both sides of said second insulator film extending in said row directions are formed so as to extend in said row directions between both sides of said pair of said trench capacitors, in which said bit line contact layers are formed, and both sides of said second insulator film extending in said column directions are formed so as to extend along and overlap with both sides, which extend in column directions, of said pair of said trench capacitors, in which said bit line contact layers are formed.

* * * * *